(12) United States Patent
Silverbrook

(10) Patent No.: US 6,258,284 B1
(45) Date of Patent: Jul. 10, 2001

(54) METHOD OF MANUFACTURE OF A DUAL NOZZLE SINGLE HORIZONTAL ACTUATOR INK JET PRINTER

(75) Inventor: Kia Silverbrook, Sydney (AU)

(73) Assignee: Silverbrook Research Pty Ltd, Balmain NSW (AU)

( * ) Notice: Subject to any disclaimer, the term of this patent is extended or adjusted under 35 U.S.C. 154(b) by 0 days.

(21) Appl. No.: 09/112,799

(22) Filed: Jul. 10, 1998

(30) Foreign Application Priority Data

Jul. 15, 1997 (AU) ............................................ PO7991
Dec. 12, 1997 (AU) ............................................ PP0874

(51) Int. Cl.[7] ............................................ B41J 2/04
(52) U.S. Cl. ............................ 216/27; 438/21; 347/54; 347/55
(58) Field of Search ....................... 216/27; 438/21; 347/54, 55

(56) References Cited

U.S. PATENT DOCUMENTS 5,726,693 * 3/1998 Sharma et al. ..................... 347/48
5,909,230 * 6/1999 Choi et al. ......................... 347/54

* cited by examiner

*Primary Examiner*—Randy Gulakowski
*Assistant Examiner*—Shamim Ahmed

(57) ABSTRACT

A method of manufacture of an ink jet printer having a dual nozzle single horizontal actuator wherein an array of nozzles are formed on a substrate utilizing planar monolithic deposition, lithographic and etching processes. Multiple ink jet heads are preferably formed simultaneously on a single planar substrate. The substrate can be a silicon wafer. The print heads are preferably formed utilizing standard vlsi/ulsi processing. Integrated drive electronics are preferably formed on the same substrate. The integrated drive electronics can comprise a CMOS process. Ink can be ejected from the substrate substantially normal to the substrate.

9 Claims, 31 Drawing Sheets

METHOD OF MANUFACTURE OF A DUAL NOZZLE SINGLE HORIZONTAL ACTUATOR INK JET PRINTER

CROSS REFERENCES TO RELATED APPLICATIONS

The following Australian provisional patent applications are hereby incorporated by cross-reference. For the purposes of location and identification, US patent applications identified by their U.S. patent application Ser. Nos. (U.S. Ser. No.) are listed alongside the Australian applications from which the U.S. patent applications claim the right of priority.

| CROSS-REFERENCED AUSTRALIAN PROVISIONAL PATENT APPLICATION NO. | US PATENT/ PATENT APPLICATION (CLAIMING RIGHT OF PRIORITY FROM AUSTRALIAN PROVISIONAL APPLICATION | DOCKET NO. |
| --- | --- | --- |
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART23 |
| PO7997 | 09/112,739 | ART15 |
| PO7979 | 09/113,053 | ART16 |
| PO8015 | 09/112,738 | ART27 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
|  | PN 6,137,500 |  |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | O9/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |

-continued

| CROSS-REFERENCED AUSTRALIAN PROVISIONAL PATENT APPLICATION NO. | US PATENT/ PATENT APPLICATION (CLAIMING RIGHT OF PRIORITY FROM AUSTRALIAN PROVISIONAL APPLICATION | DOCKET NO. |
| --- | --- | --- |
| PO7951 | 09/113,113 | IJM22 |
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 6,110,759 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 6,152,619 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to the field of ink jet printing and, in particular, discloses a method of manufacture of an ink jet printer having a dual nozzle single horizontal actuator ink jet.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide for a method of manufacture of an ink jet printer having a dual nozzle single horizontal actuator inkjet printer.

In accordance with a first aspect of the present invention, there is provided a method of manufacture of an ink jet printer having a dual nozzle single horizontal actuator wherein an array of nozzles are formed on a substrate utilising planar monolithic deposition, lithographic and etching processes.

Multiple ink jet heads are preferably formed simultaneously on a single planar substrate which can comprise a silicon wafer.

The print heads are preferably formed utilising standard vlsi/ulsi processing and integrated drive electronics are preferably formed on the same substrate. The integrated drive electronics may be formed utilising a CMOS fabrication process.

Ink can be ejected from the substrate substantially normal to the substrate.

In accordance with a further aspect of the present invention, there is provided a method of manufacture of a thermally actuated ink jet printer comprising a series of nozzle chambers which ejects ink via the utilization of a thermal actuator device, comprising the steps of: (a) initially providing a silicon wafer having a circuitry wafer layer including the electrical circuitry necessary for the operation of the thermal actuators on demand; (b) etching at least one nozzle chamber pit in the circuitry wafer layer and the silicon wafer; (c) depositing and etching a sacrificial layer filling the ink chamber pit, the etching including etching a first portion of a nozzle chamber wall mold and an actuator anchor mold; (d) depositing and etching a first inert material layer, filling the nozzle chamber wall mould and the actuator anchor mold, the etching including etching a via to the electrical circuitry; (e) depositing and etching a first conductive material layer defining a lower heater element conductively interconnected via the via to the electrical circuitry; (f) depositing and etching a second inert material layer, the etching defining an actuator arm attached to the lower heater element and a second portion of the nozzle chamber wall; (g) depositing and etching a second conductive material layer defining an upper heater element conductively interconnected via a via through the first and second inert material layers to the electrical circuitry; (h) depositing and etching a third inert material layer defining an actuator anchor and further portions of the nozzle chamber wall; (i) depositing and etching a sacrificial layer; (j) depositing and etching a forth inert material layer defining remaining portions of the nozzle chamber, the etching including etching at least one ink ejection nozzle in one of the nozzle chamber walls; (k) etching an ink supply channel to the nozzle chamber through the wafer; and (l) etching away the sacrificial layers.

The step (k) preferably can include etching an interconnecting channel to one of the nozzle chamber pits.

The number of ink ejection nozzles can be at least two.

The conductive material layers are preferably formed from a material having a high Young's modulus such as titanium nitride or a copper nickel alloy. The inert material layers can comprise substantially glass.

The steps are preferably also utilized to simultaneously separate the wafer into separate printheads.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

The preferred embodiment of the present invention includes an inkjet arrangement wherein a single actuator drives two output nozzles. When the actuator is driven in a first direction, ink is ejected out of a first nozzle and when the actuator is driven in a second direction, ink is ejected out of a second nozzle. The paddle actuator is interconnected via a slot in the nozzle chamber wall to a rigid thermal actuator which can be actuated so as to cause the ejection of ink from the ink ejection holes.

Figure 6:
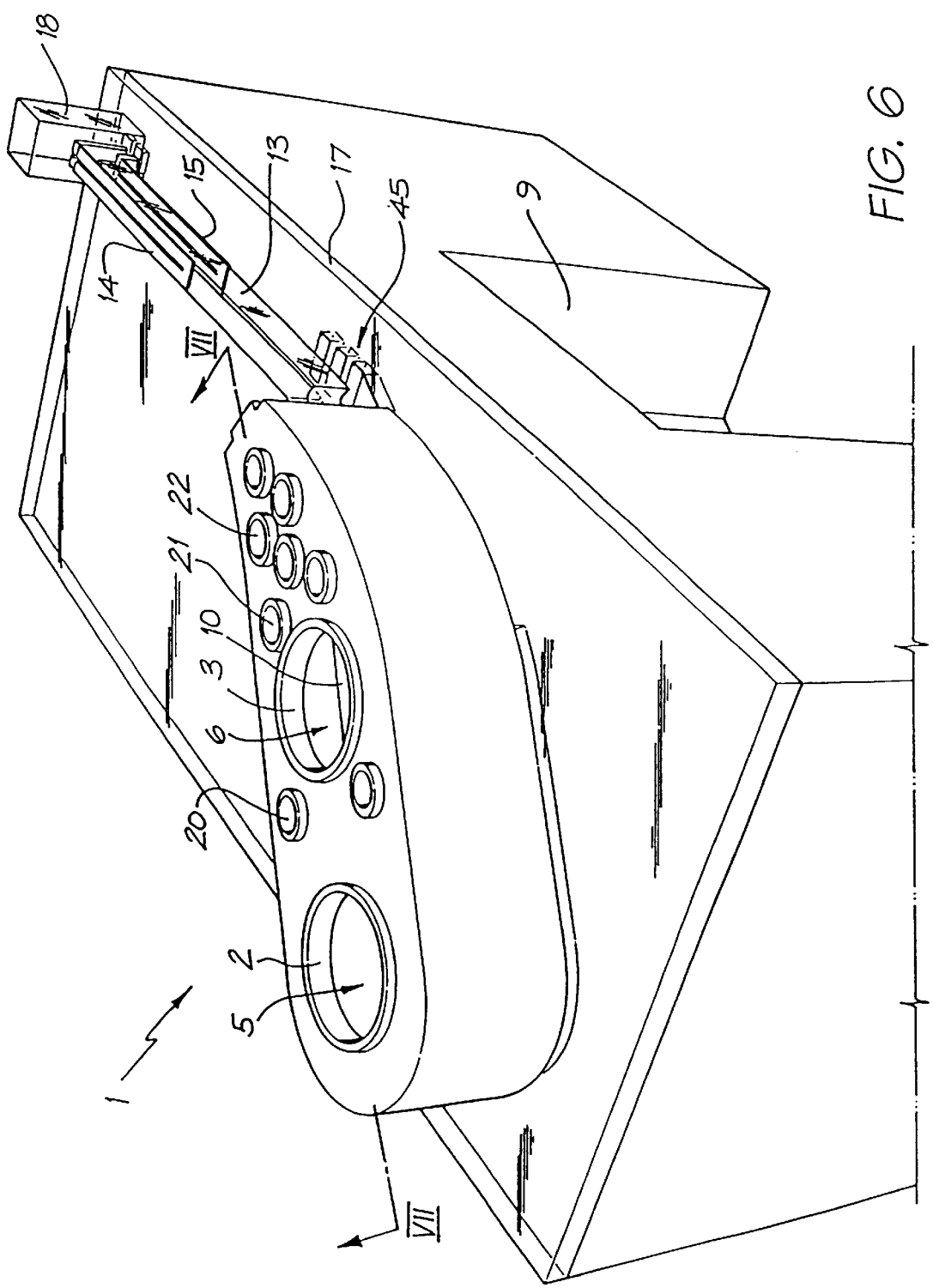
FIG. 6 illustrates a perspective view, of a single nozzle arrangement of the preferred embodiment.
Figure 7:
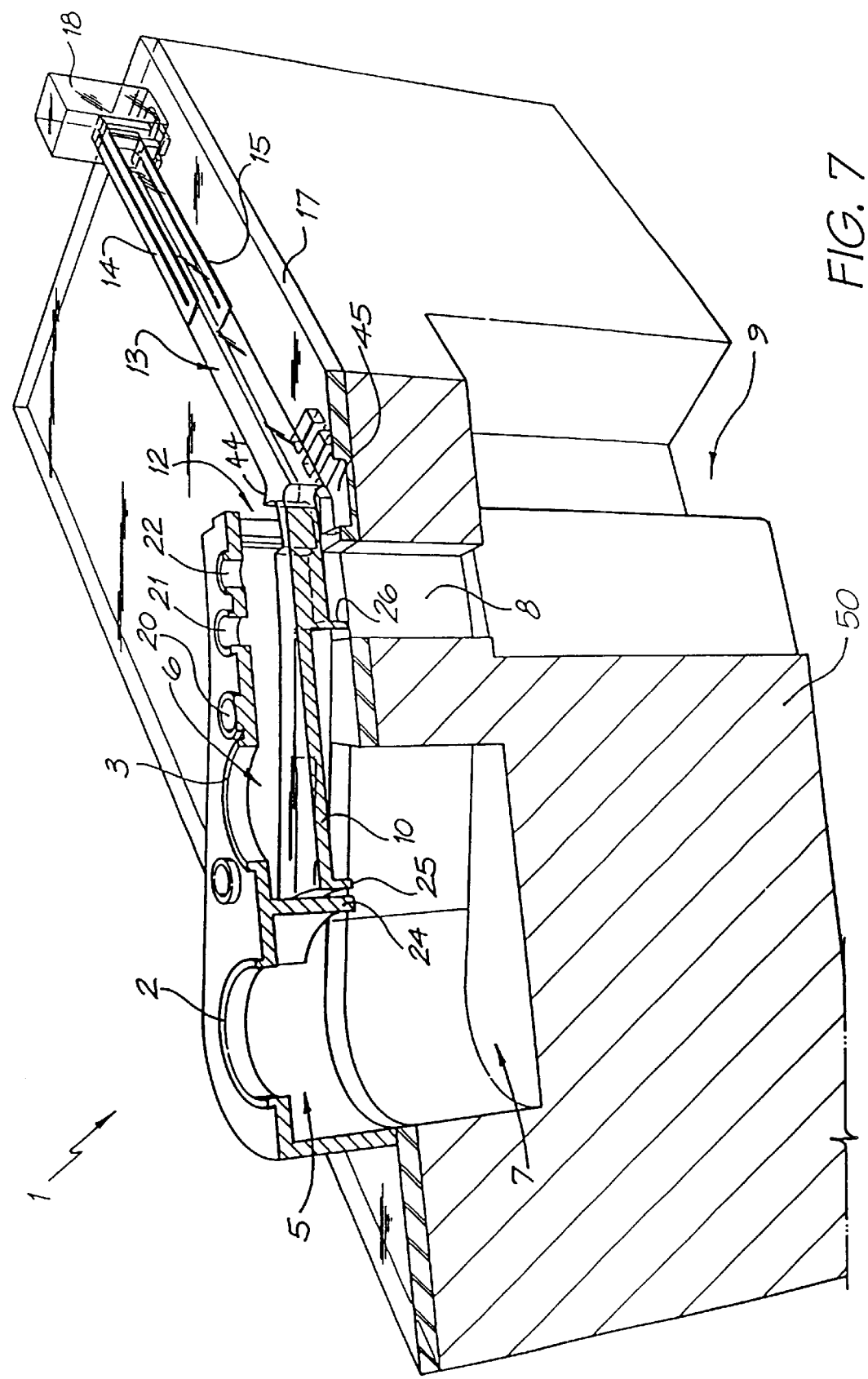
FIG. 7 illustrates a perspective view, partly in section of a single nozzle arrangement of the preferred embodiment.

Turning initially to FIGS. 6 and 7, there is illustrated a nozzle arrangement 1 of the preferred embodiment with FIG. 7 being a sectional view through the line VII—VII of FIG. 6. The nozzle arrangement 1 includes two ink ejection ports 2, 3 for the ejection of ink from within a nozzle chamber. The nozzle chamber further includes first and second chamber portions 5, 6 in addition to an etched cavity 7 which, during normal operation, are normally filled with ink supplied via an ink inlet channel 8. The ink inlet channel 8 is in turn connected to an ink supply channel 9 etched through a silicon wafer 50. Inside the nozzle chamber is located an actuator paddle 10 which is interconnected through a slot 12 in the chamber wall to an actuator arm 13 which is actuated by means of thermal actuators 14, 15 which are in turn connected to a substrate 17 via an end block portion 18 with the substrate 17 providing the relevant electrical interconnection for the heaters 14, 15.

Hence, the actuator arm 13 can be actuated by the thermal actuators 14, 15 to move up and down so as to eject ink via the nozzle holes 2 or 3. A series of holes eg. 20–22 are also provided in a top of the nozzle plate. As will become more readily apparent hereinafter, the holes 20–22 assist in the etching of sacrificial layers during construction in addition to providing for "breathing" assistance during operation of the nozzle arrangement 1. The two chambers 5, 6 are separated by a baffle 24 and the paddle arm 10 includes an end lip portion 25 in addition to a plug portion 26. The plug portion 26 is designed to mate with the boundary of the ink inlet channel 8 during operation.

Figure 1:
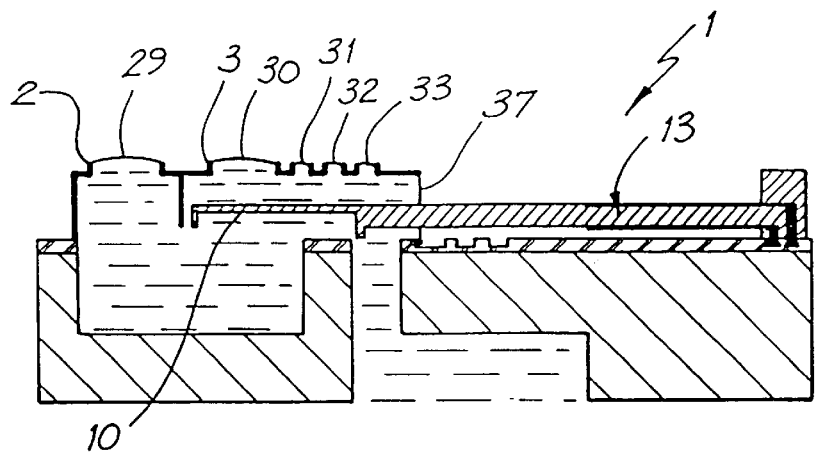
FIG. 1 shows a schematic side view of an ink jet nozzle of the invention in a quiescent state.

Turning now to FIGS. 1–5, there will now be explained the operation of the nozzle arrangement 1. Each of FIGS. 1–5 illustrate a cross sectional view of the nozzle arrangement during various stages of operation. Turning initially to FIG. 1, there is shown the nozzle arrangement 1 when in its quiescent position. In this state, the paddle 10 is idle and ink fills the nozzle chamber so as to form menisci 29–33 and 37.

Figure 3:
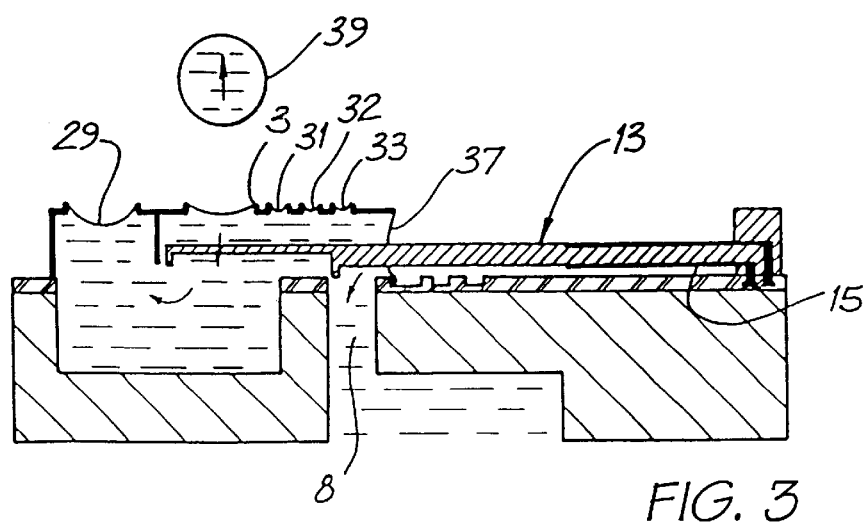
FIG. 3 shows a schematic side view of the nozzle in a further part of the ink ejection stage from the first nozzle opening.

When it is desired to eject a drop out of the nozzle port 3, as indicated in FIG. 3, the bottom heater 15 is actuated. The heater 15 can comprise a 60% copper and 40% nickel alloy which has a high bending efficiency where the bending efficiency is defined as:

$$\text{bend efficiency} = \frac{\text{Young's Modulus} \times (\text{Coefficient of Thermal Expansion})}{\text{Density} \times \text{Specific Heat Capacity}}$$

The two heaters 14, 15 can be constructed from the same material and normally exist in a state of balance when the paddle 10 is in its quiescent position. As noted previously, when it is desired to eject a drop out of nozzle chamber 3 port, the heater 15 is actuated which causes a rapid upwards movement of the actuator paddle 10. This causes a general increase in pressure in the area in front of the actuator paddle 10 which further causes a rapid expansion in the meniscus 30 in addition to a much less significant expansion in the menisci 31–33 (due to their being of a substantially smaller radius). Additionally, the substantial decrease in pressure around the back surface of the paddle 10 causes a general inflow of ink from the nozzle chamber portion 5 in addition to causing a general collapse in the meniscus 29 and a corresponding flow of ink 35 around the baffle 24. A slight bulging also occurs in the meniscus 37 around the slot 12 in the side wall.

Turning now to FIG. 3, the heater 15 is merely pulsed and turned off when it reaches its maximum extent. Hence, the paddle actuator 10 rapidly begins to return to its quiescent position causing the ink around the ejection port 3 to begin to flow back into the chamber. The forward momentum of the ink in the expanded meniscus and the backward pressure exerted by actuator paddle 10 results in a general necking of the meniscus and the subsequent breaking off of a separate drop 39 which proceeds to the print media. The menisci 29, 31, 32 and 33 each of a generally concave shape exert a further force on the ink within the nozzle chamber which begins to draw ink in from the ink inlet channel 8 so as to replenish the nozzle chamber. Eventually, the nozzle arrangement returns to the quiescent position which is as previously illustrated in respect of FIG. 1.

Figure 4:
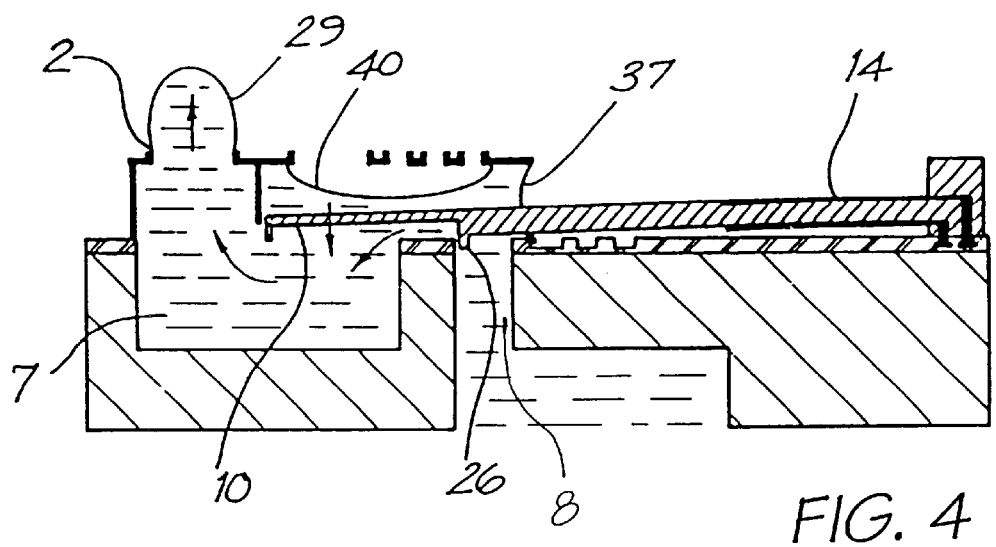
FIG. 4 shows a schematic side view of the nozzle in an initial part of an ink ejection stage from a second nozzle opening of the nozzle.
Figure 5:
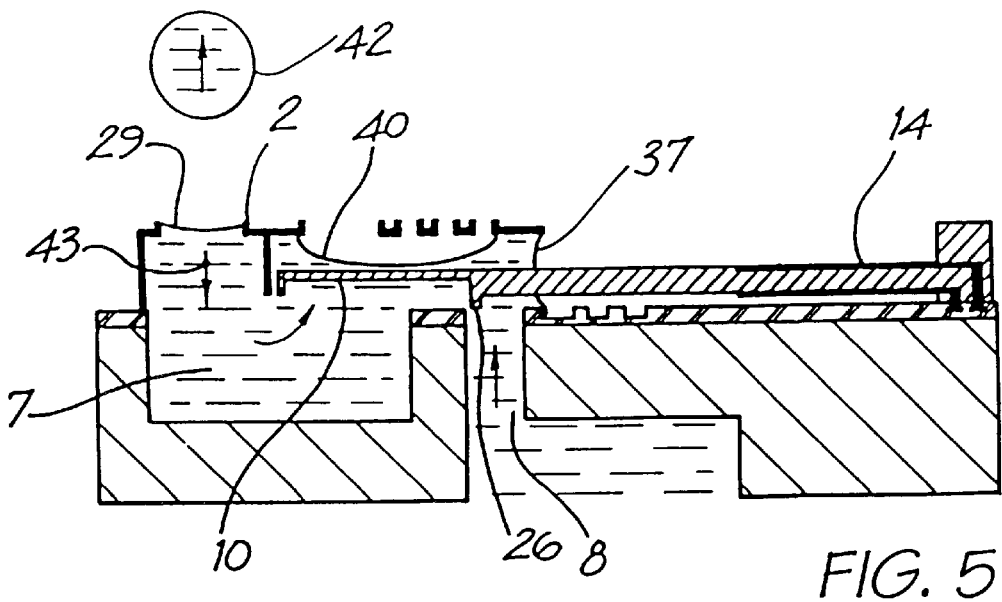
FIG. 5 shows a schematic side view of the nozzle in a further part of the ink ejection stage from the second nozzle opening.

Turning now to FIG. 4, when it is desired to eject a droplet of ink out of the ink ejection port 2, the thermal actuator 14 is actuated resulting in a general expansion of the thermal actuator 14 which in turn causes a rapid downward movement of the actuator paddle 10. The rapid downward movement causes a substantial increase in pressure within the cavity 7 which in turn results in a general rapid expansion of the meniscus 29. The end plug portion 26 results in a general blocking of the ink supply channel 8 stopping fluid from flowing back down the ink supply channel 8. This further assists in causing ink to flow towards the cavity 7. The menisci 30–33 of FIG. 1 are drawn generally into the nozzle chamber and may unite so as to form a single meniscus 40. The meniscus 37 is also drawn into the chamber. The heater 14 is merely pulsed, which as illustrated in FIG. 5 results in a rapid return of the paddle 10 to its quiescent position. The return of the paddle 10 results in a general reduction in pressure within the cavity 7 which in turn results in the ink around the nozzle 2 beginning to flow 43 back into the nozzle chamber. The forward momentum of the ink around the meniscus 29 in addition to the backflow 43 results in a general necking of the meniscus and the formation of an ink drop 42 which separates from the main body of the ink and continues to the print media.

Figure 2:
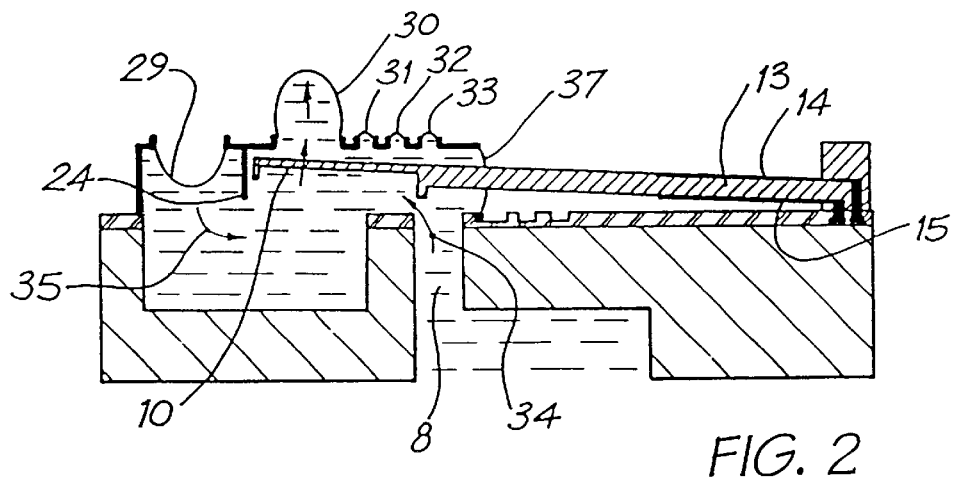
FIG. 2 shows a schematic side view of the nozzle in an initial part of an ink ejection stage from a first nozzle opening of the nozzle.

The return of the actuator paddle 10 further results in plugging portion 26 "unplugging" the ink supply channel 8. The general reduction in pressure in addition to the collapsed menisci 40, 37 and 29 results in a flow of ink from the ink inlet channel 8 into the nozzle chamber so as to cause replenishment of the nozzle chamber and return to the quiescent state as illustrated in FIG. 2.

Returning now to FIG. 6 and FIG. 7, a number of other important features of the preferred embodiment include the fact that each nozzle eg. 2, 3, 20, 21, 22, 12 etc. includes a nozzle rim around its outer periphery. The nozzle rim acts to stop wicking of the meniscus formed across the nozzle rim. Further, the actuator arm 13 is provided with a wick minimisation protrusion eg. 44 in addition to a series of pits eg. 45 which were again shaped so as to minimise wicking along the surfaces surrounding the actuator arms 13.

The nozzle arrangement of the preferred embodiment can be formed on a silicon wafer utilising standard semiconductor fabrication processing steps and micro-electromechanical systems (MEMS) construction techniques.

For a general introduction to a micro-electro mechanical system (MEMS) reference is made to standard proceedings in this field including the proceeding of the SPIE (International Society for Optical Engineering) including volumes 2642 and 2882 which contain the proceedings of recent advances and conferences in this field.

Preferably, a large wafer of printheads is constructed at any one time with each printhead providing a predetermined pagewidth capabilities and a single printhead can in turn comprise multiple colors so as to provide for full color output as would be readily apparent to those skilled in the art.

Figure 8:
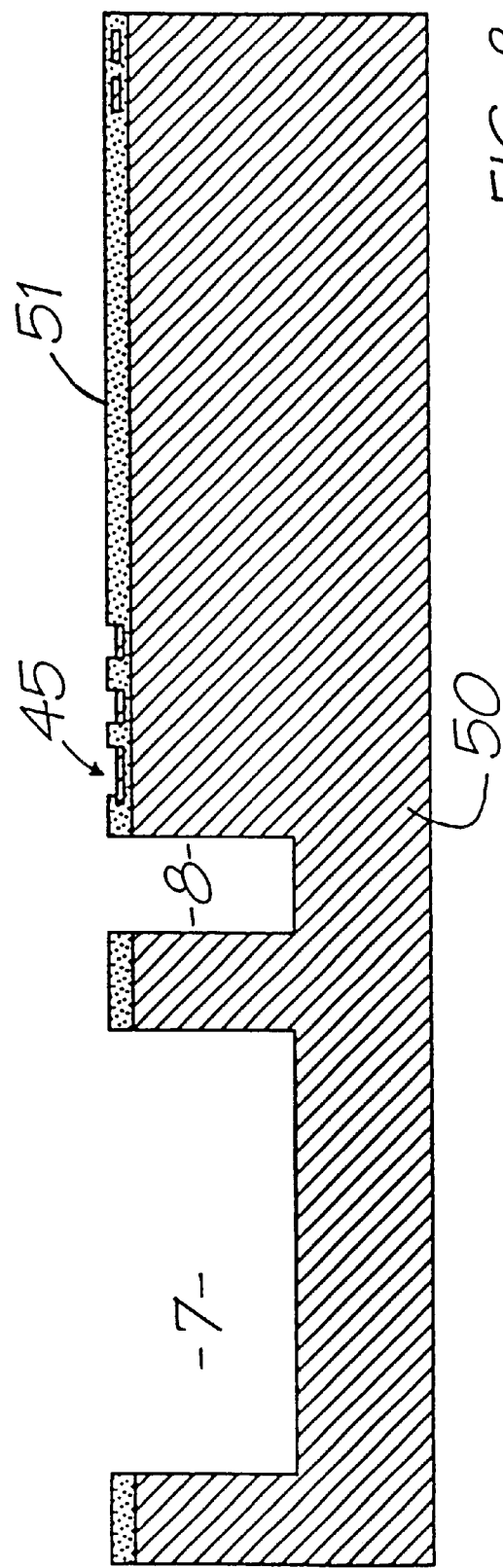
FIG. 8 shows a schematic side view of an initial stage in the manufacture of an ink jet nozzle of the invention showing a step of an initial etch to form a nozzle cavity and an ink inlet.
Figure 9:
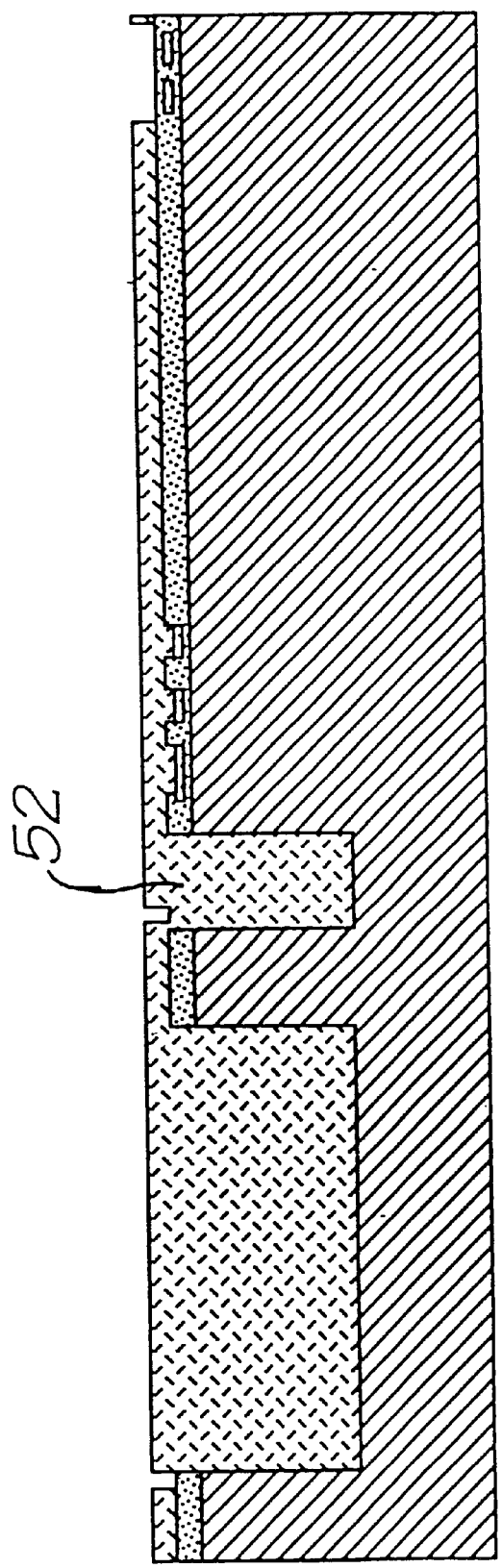
FIG. 9 shows a step of depositing a first sacrificial layer.
Figure 10:
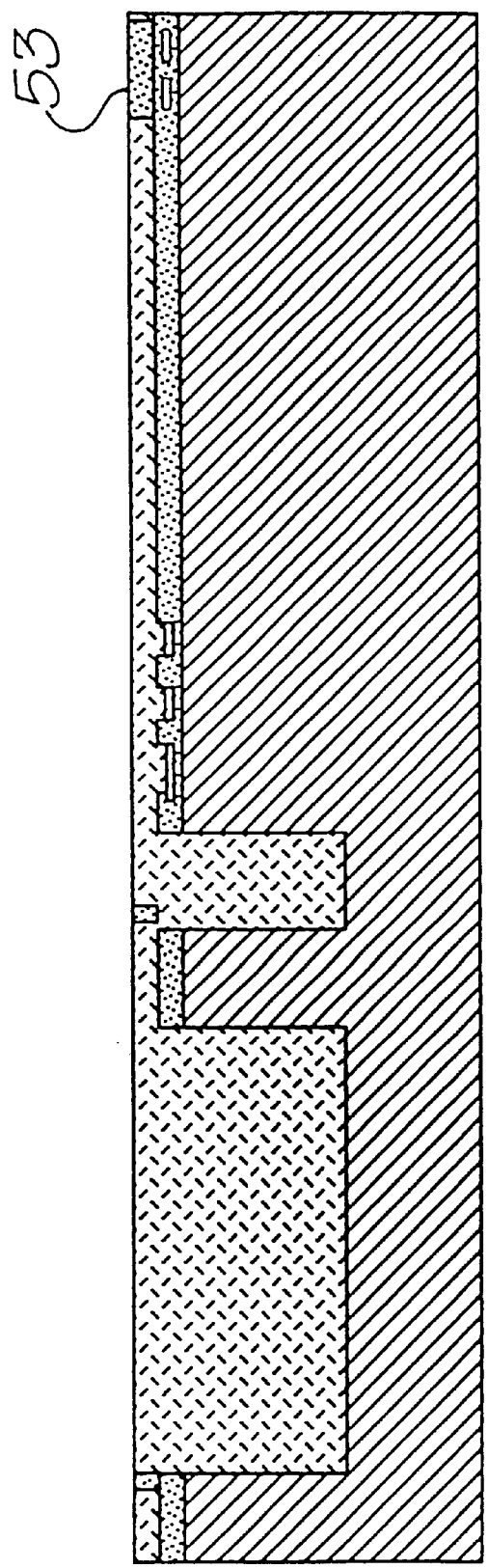
FIG. 10 shows a step of depositing a planarizing glass layer.
Figure 11:
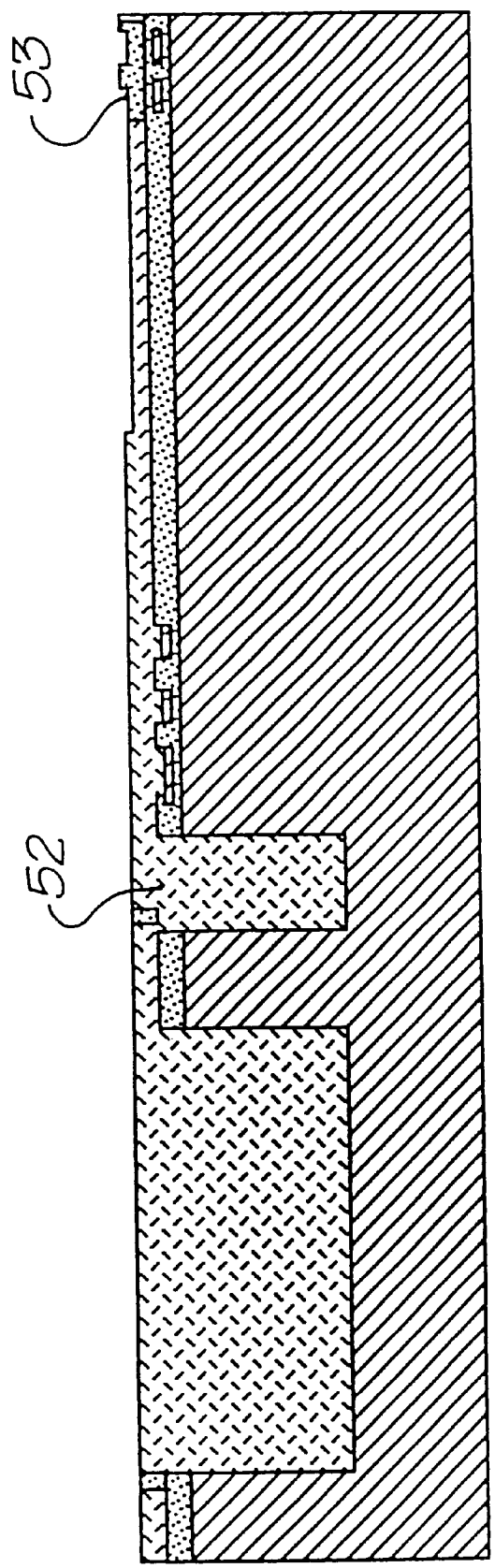
FIG. 11 shows a step of etching the sacrificial material layer.
Figure 12:
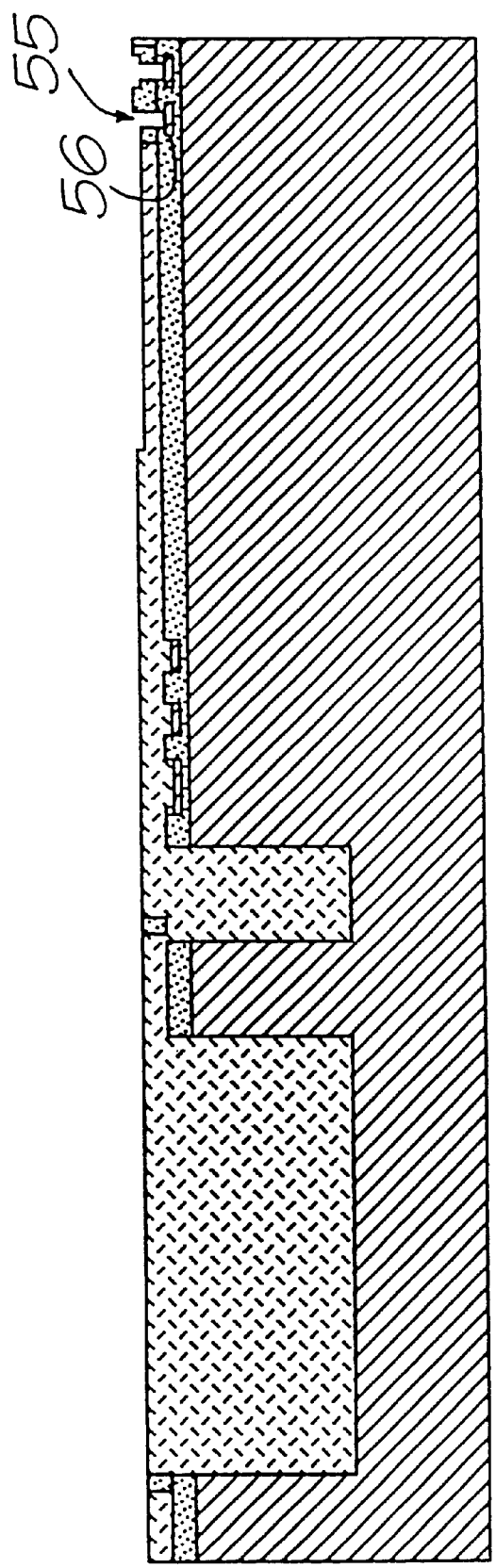
FIG. 12 shows a step of etching the glass layer.
Figure 13:
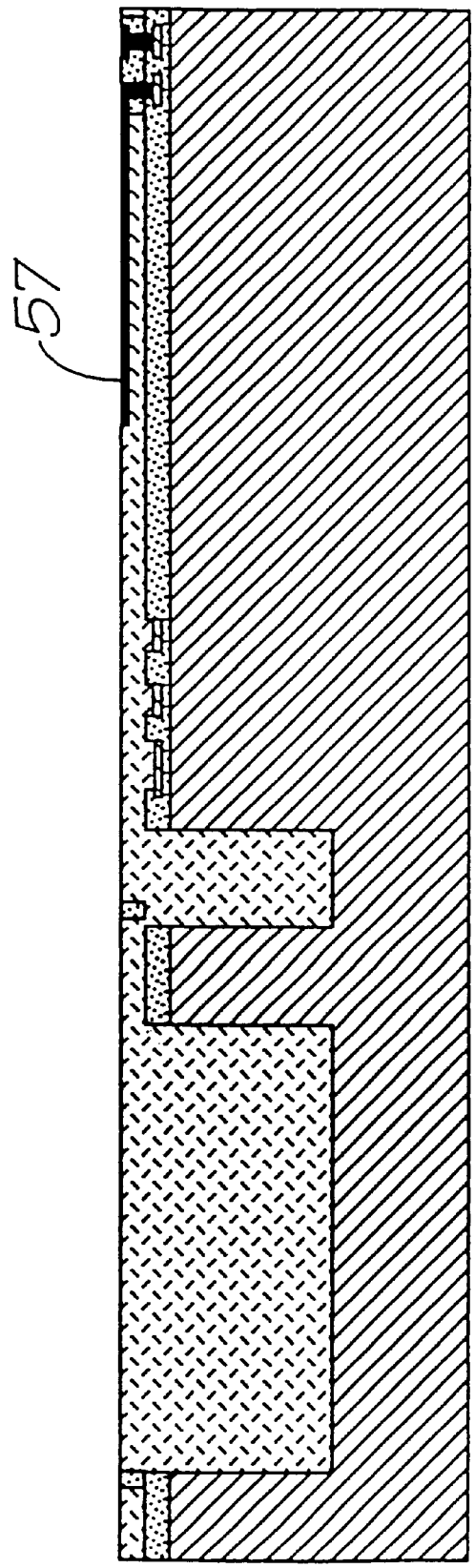
FIG. 13 shows a step of depositing a first heater material layer.
Figure 14:
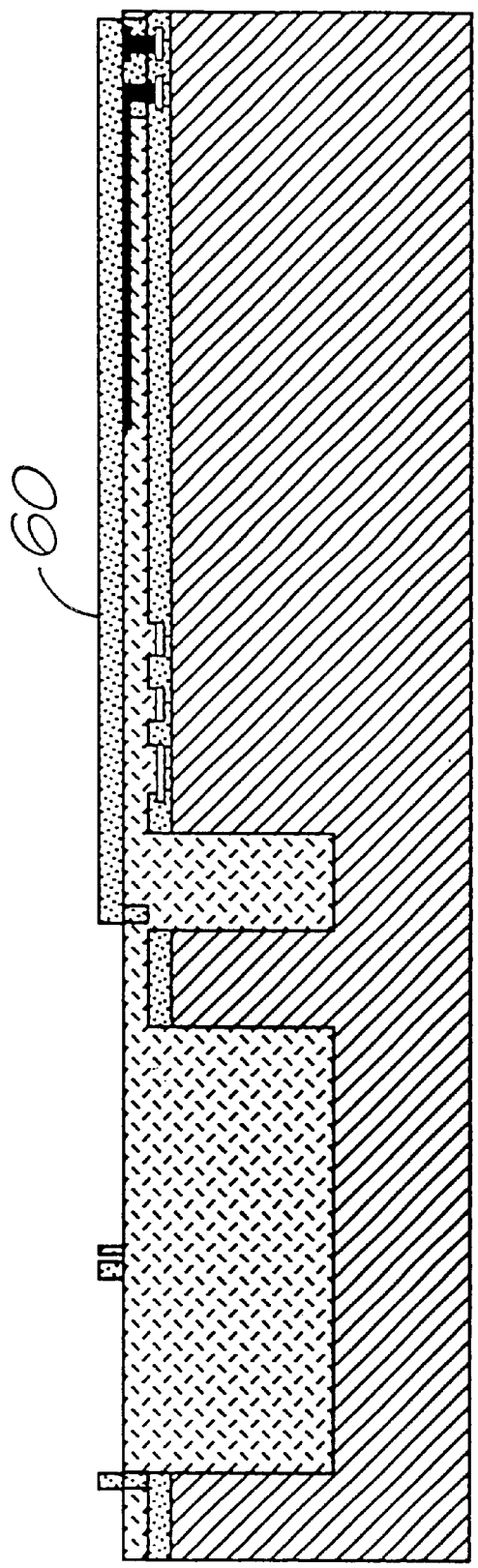
FIG. 14 shows a step of depositing and etching a further glass layer.
Figure 15:
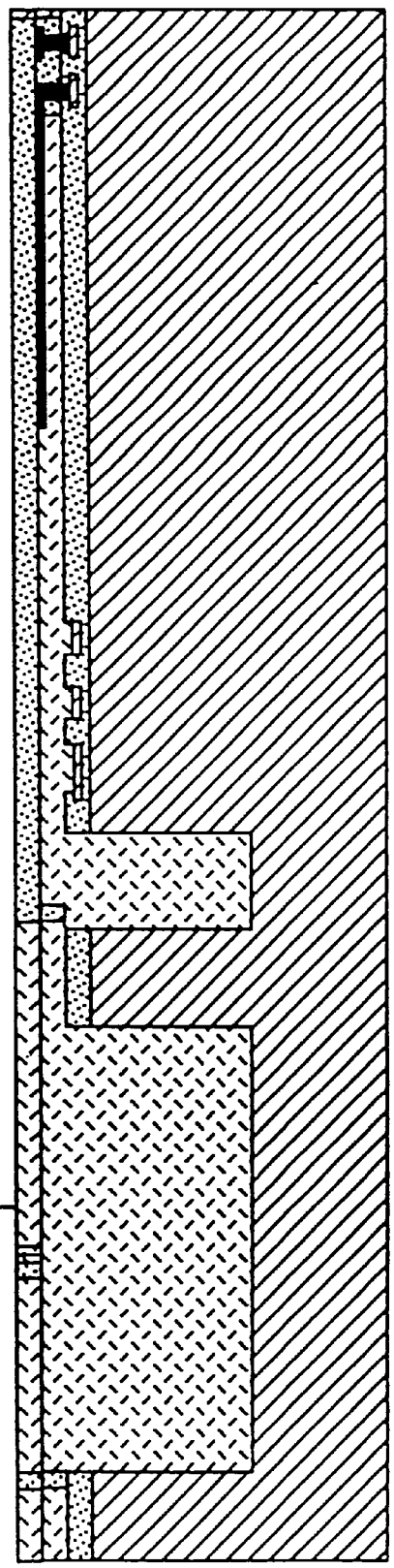
FIG. 15 shows a step of depositing an aluminum layer.
Figure 16:
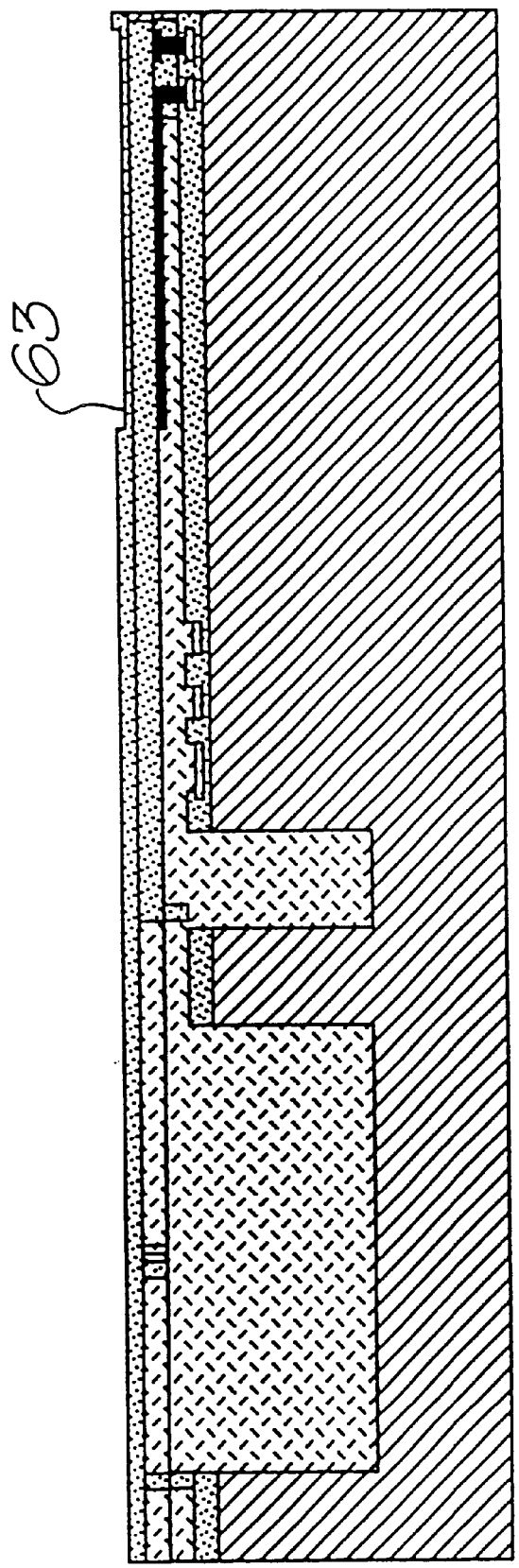
FIG. 16 shows a step of depositing a glass layer.
Figure 17:
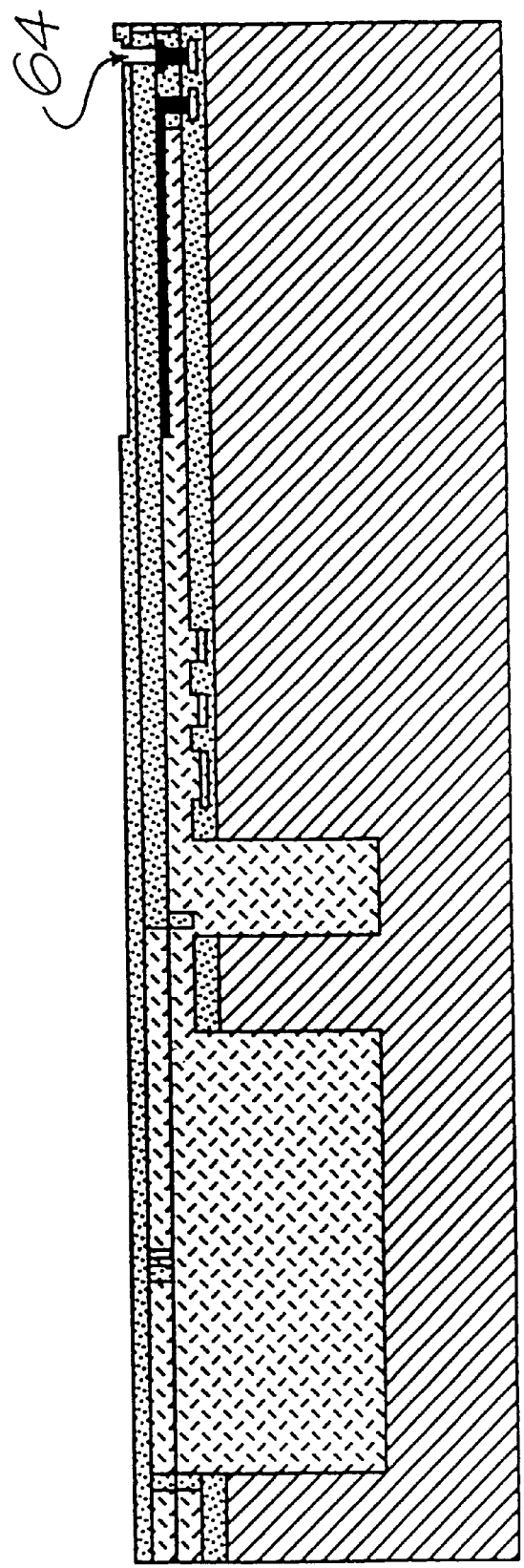
FIG. 17 shows a step of etching the glass layer.
Figure 18:
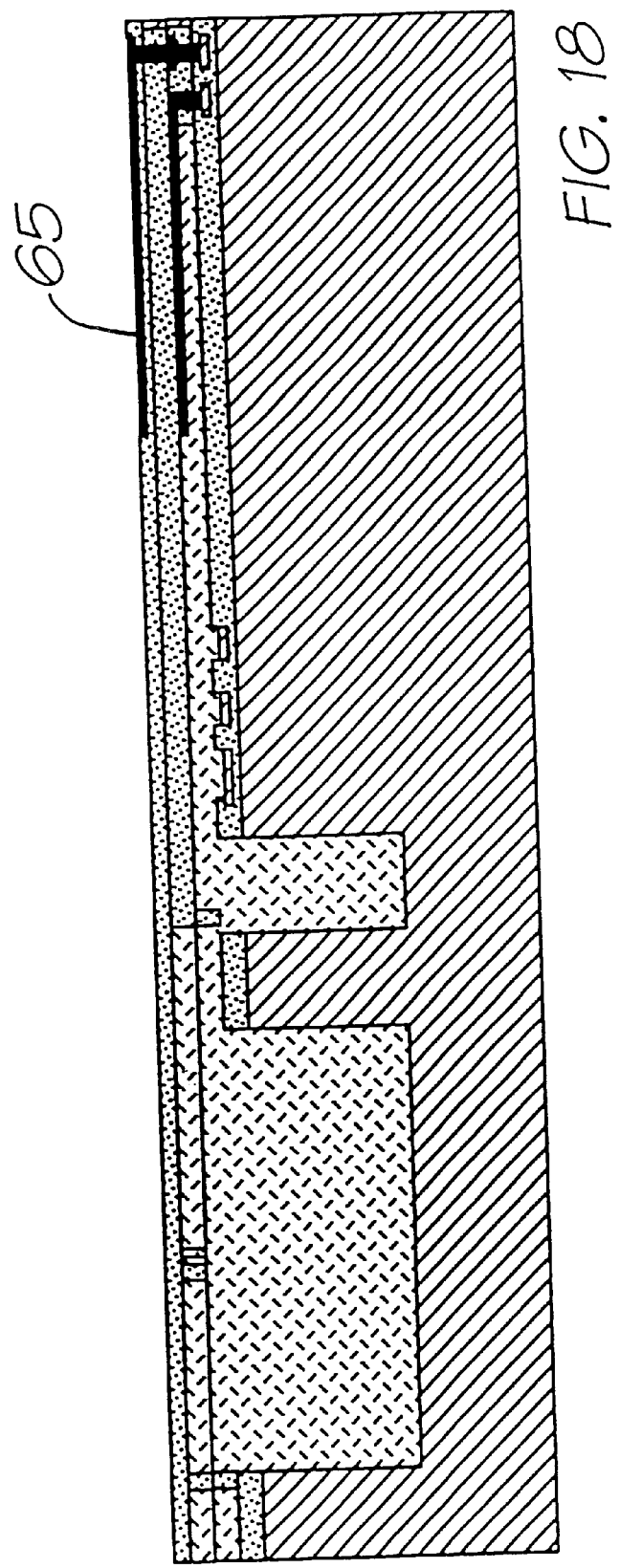
FIG. 18 shows a step of depositing a further heater material layer.
Figure 19:
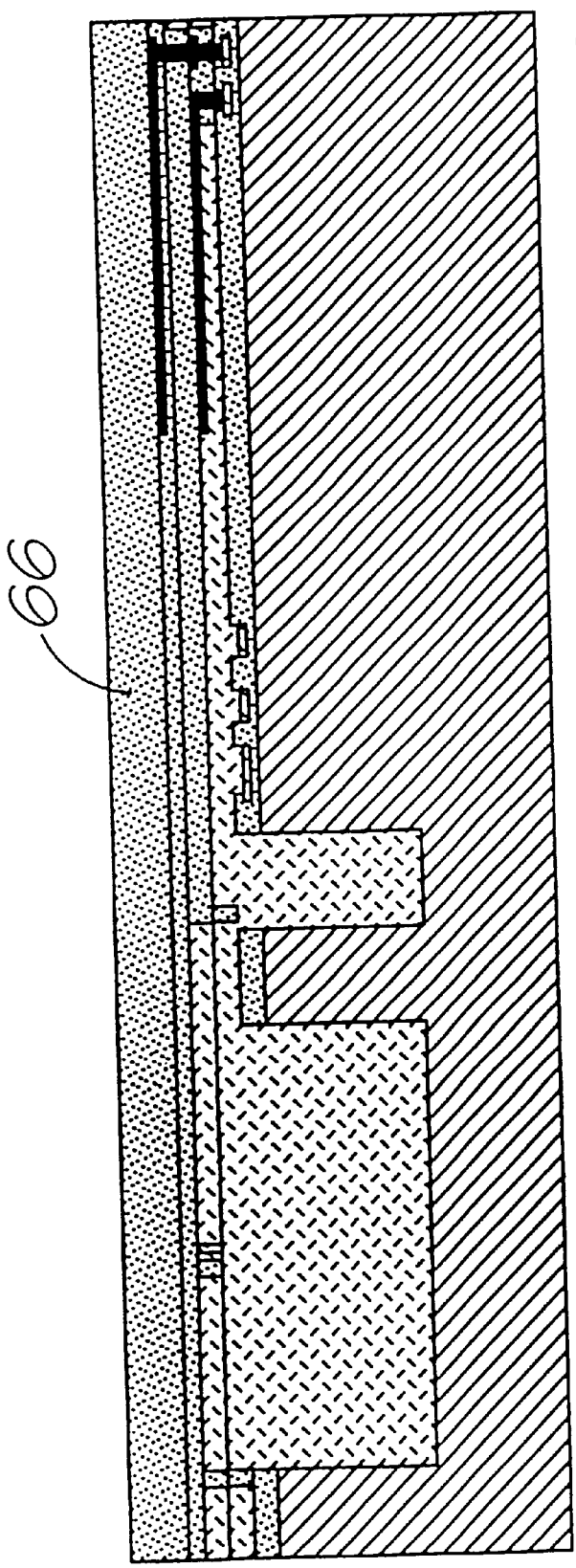
FIG. 19 shows a step of depositing another glass layer.
Figure 20:
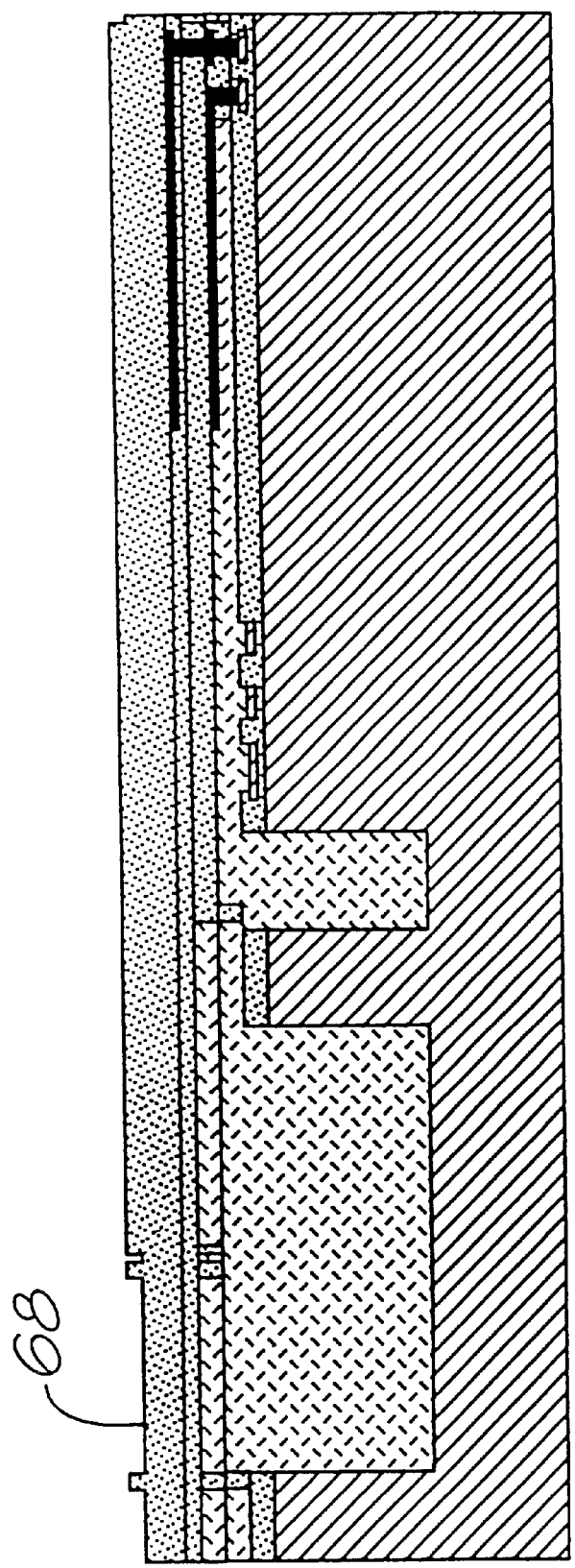
FIG. 20 shows a step of etching the glass layer.
Figure 21:
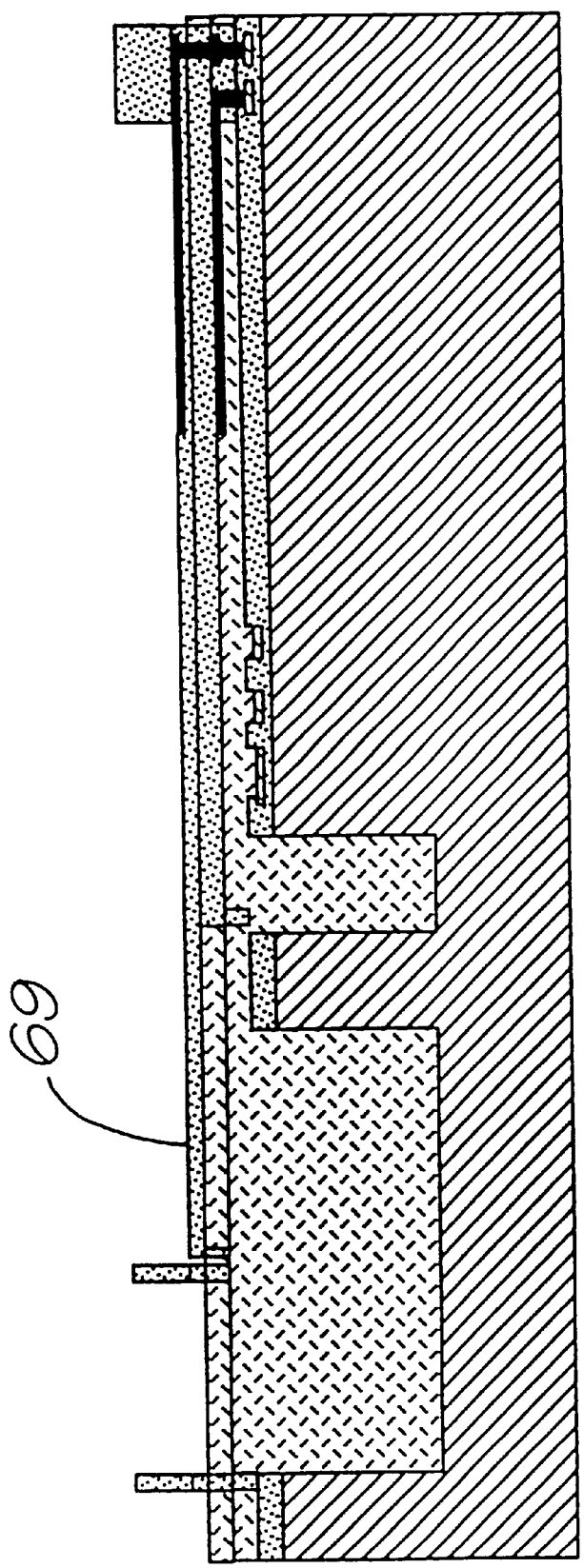
FIG. 21 shows a step of further etching the glass layer.
Figure 22:
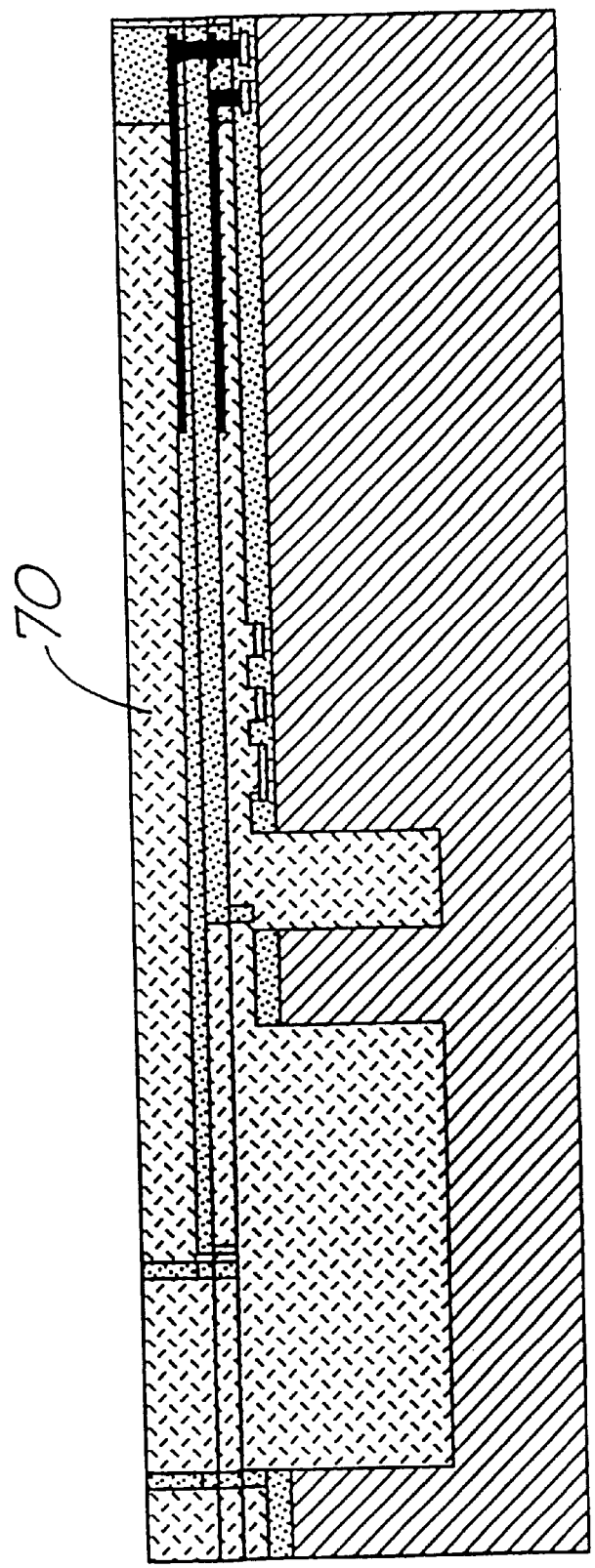
FIG. 22 shows a step of depositing a further sacrificial material layer.
Figure 23:
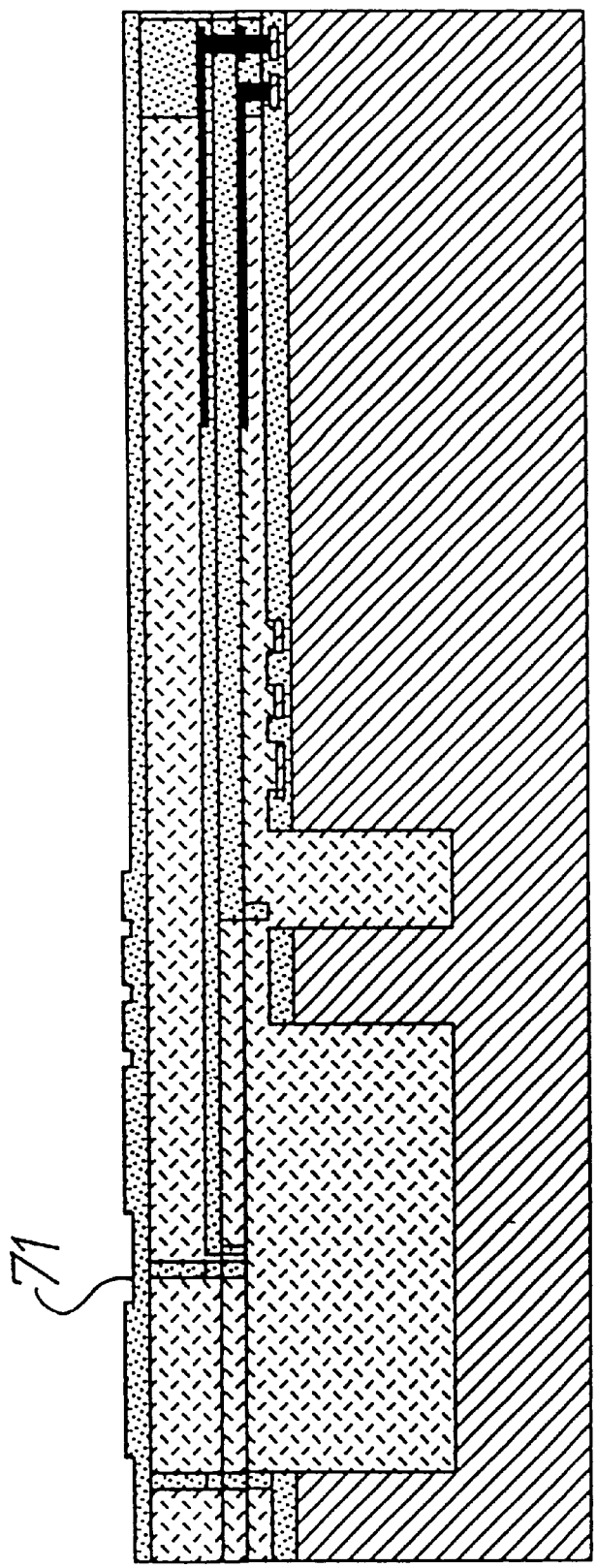
FIG. 23 shows a step of depositing another glass layer.
Figure 24:
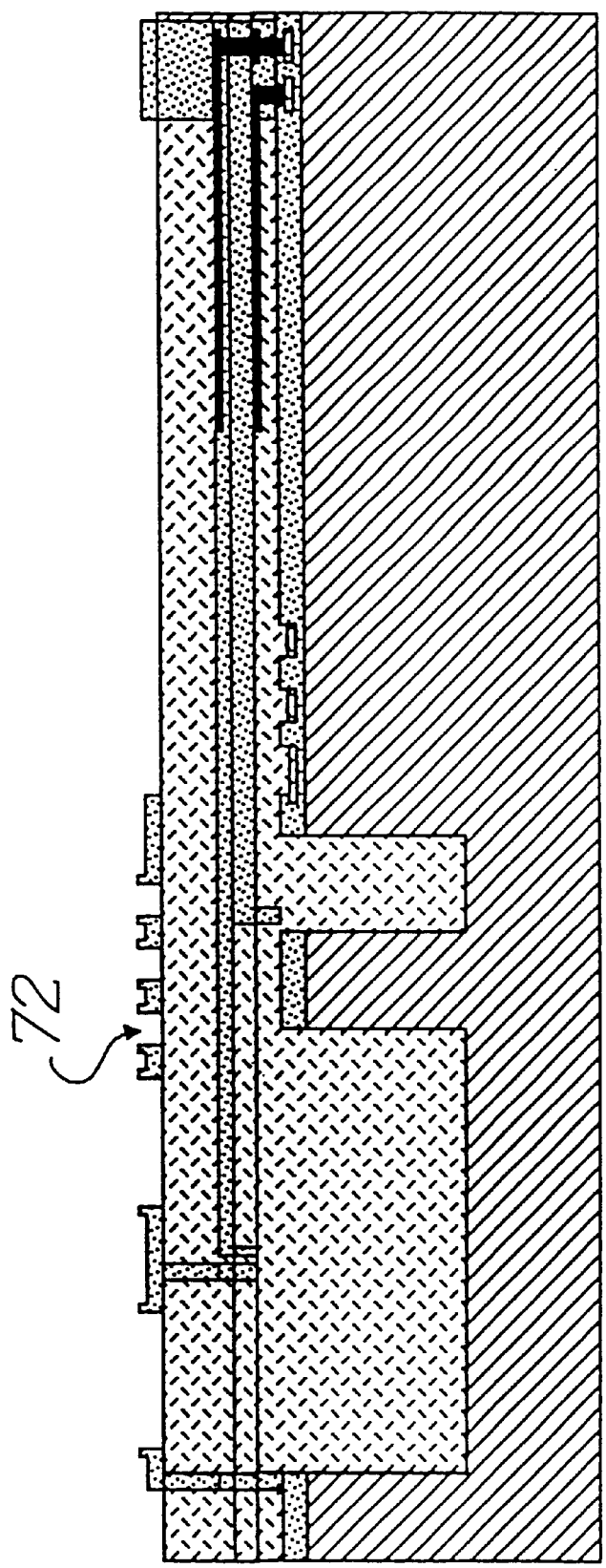
FIG. 24 shows a step of etching the glass layer deposited at the step of FIG. 23.
Figure 25:
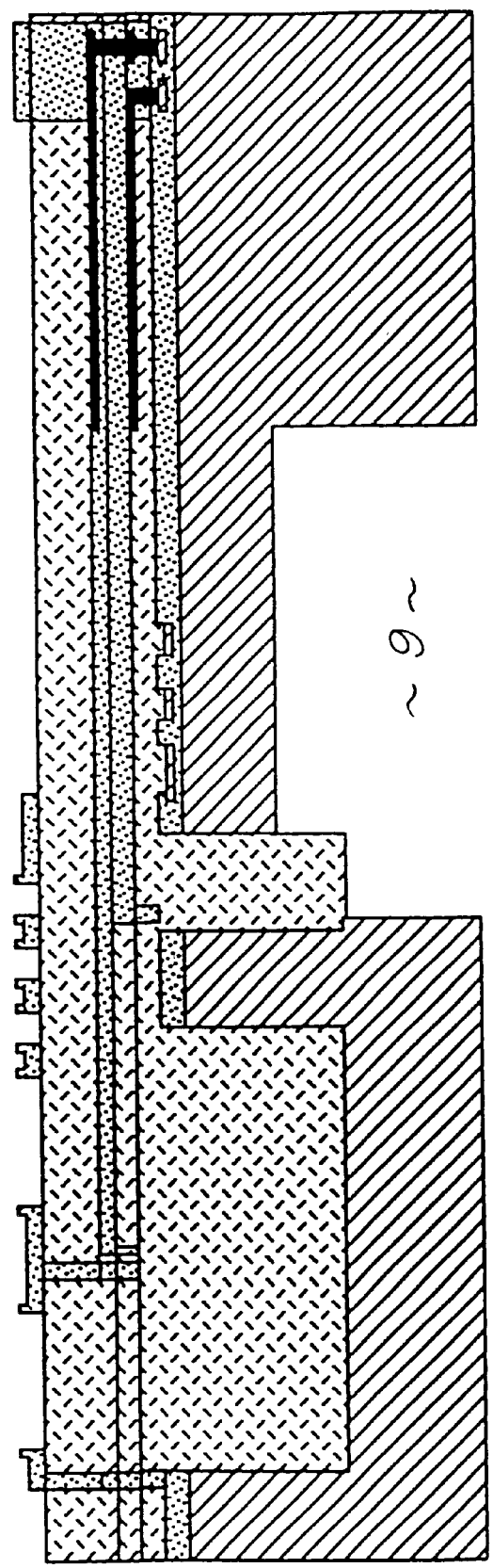
FIG. 25 shows a step of back etching the substrate.
Figure 26:
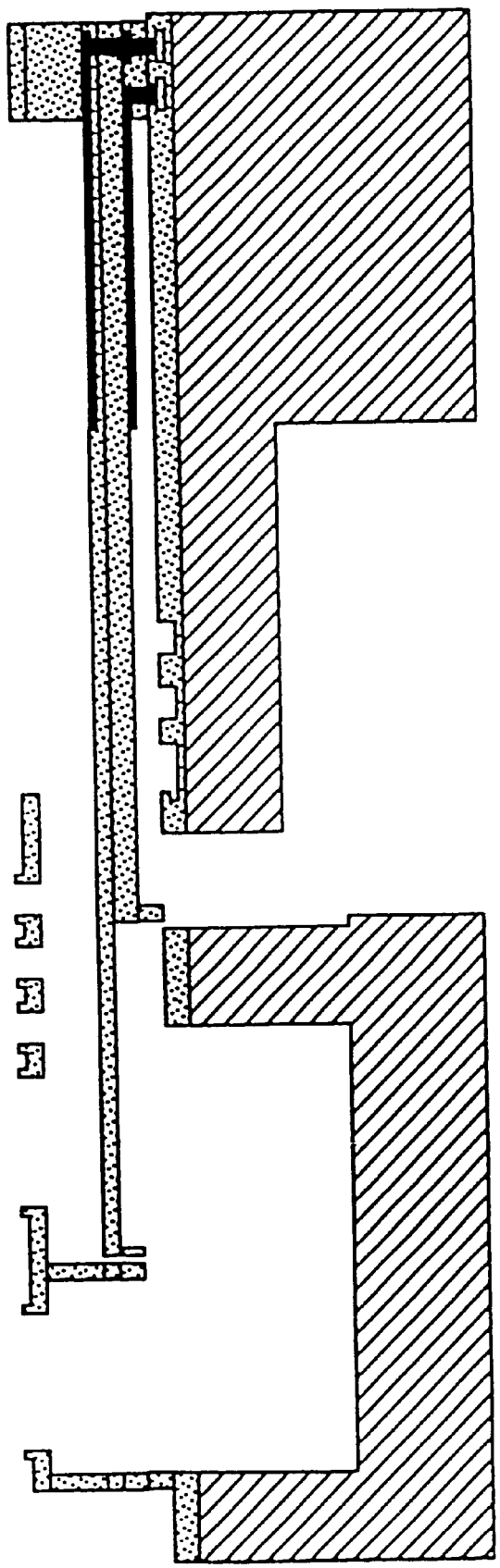
FIG. 26 shows a step of etching the sacrificial material layers.

Turning to FIG. 8–FIG. 26 there will now be explained one form of fabrication of the preferred embodiment. The preferred embodiment can start with a CMOS processed silicon wafer 50 which can include a standard CMOS layer 51 of the relevant electrical circuitry etc. The processing steps can then be as follows:

1. As illustrated in FIG. 8 a deep silicon etch is performed so as to form the nozzle cavity 7 and ink inlet 8. A series of pits eg. 45 are also etched down to an aluminum portion of the CMOS layer 51.
2. Next, as illustrated in FIG. 9, a sacrificial material layer 52 is deposited and planarised using a standard Chemical Mechanical Planarization (CMP) process before being etched with a nozzle wall mask so as to form cavities for the nozzle wall, plug portion and interconnect portion. A suitable sacrificial material is aluminum which is often utilised in MEMS processes as a sacrificial material.
3. Next, as illustrated in FIG. 10, a 3 µm layer of low stress glass 53 is deposited and planarized utilising CMP.
4. Next, as illustrated in FIG. 11, the sacrificial material 52 is etched to a depth of 1.1 µm and the glass 53 is further etched at least 1.1 µm utilising a first heater mask.
5. Next, as illustrated in FIG. 12, the glass is etched eg. 55 down to an aluminum layer eg. 56 of the CMOS layer.
6. Next, as illustrated in FIG. 13, a 3 µm layer 57 of 60% copper and 40% nickel alloy is deposited and planarized utilising CMP. The copper and nickel alloy hereinafter called "cupronickel" is a material having a high "bend efficiency" as previously described.
7. Next, as illustrated in FIG. 14, a 3 µm layer 60 of low stress glass is deposited and etched utilising a first paddle mask.
8. Next, as illustrated in FIG. 15, a further 3 µm 61 layer of aluminum is deposited and planarized utilising chemical mechanical planarization.
9. Next, as illustrated in FIG. 16, a 2 µm layer 63 of low stress glass is deposited and etched by 1.1 µm utilising a heater mask for the second heater.
10. As illustrated in FIG. 17, the glass is etched down to the cupronickel layer 57 so as to provide for the upper level heater contact 64.
11. Next, as illustrated in FIG. 18, a 3 µm layer 65 of cupronickel alloy is deposited and planarized utilizing CMP.
12. Next, as illustrated in FIG. 19, a 71 µm layer 66 of low stress glass is deposited.
13. Next, as illustrated in FIG. 20 the glass 66 is etched as at 68 to a depth of 2 µm utilizing a mask for the paddle.
14. Next, as illustrated in FIG. 21, the glass 66 is etched as at 69 to a depth of 7 µm using a mask for the nozzle walls, portions of the actuator and the post portion.
15. Next, as illustrated in FIG. 22, a 9 µm layer 70 of sacrificial material is deposited and planarized utilising CMP.
16. Next, as illustrated in FIG. 23, a 3 µm layer 71 of low stress glass is deposited and etched to a depth of 1 µm utilizing a nozzle rim mask.
17. Next, as illustrated in FIG. 24, the glass 71 is etched as at 72 down to the sacrificial layer 70 utilising a nozzle mask.
18. Next, as illustrated in FIG. 25, an ink supply channel 9 is etched through from the back of the wafer utilizing a silicon deep trench etcher which has near vertical side wall etching properties. A suitable silicon trench etcher is the deep silicon trench etcher available from Silicon Technology Systems of the United Kingdom. The printheads can also be "diced" as a result of this etch.
19. Next, as illustrated in FIG. 26, the sacrificial layers are etched away utilising a wet etch so as release the structure of the printhead.

The printheads can then be washed and inserted in an ink chamber molding for providing an ink supply to the back of the wafer so to allow ink to be supplied via the ink supply channel. The printhead can then have one edge along its surface TAB bonded to external control lines and preferably a thin anti-corrosion layer of ECR diamond-like carbon deposited over its surfaces so as to provide for anti corrosion capabilities.

Figure 27:
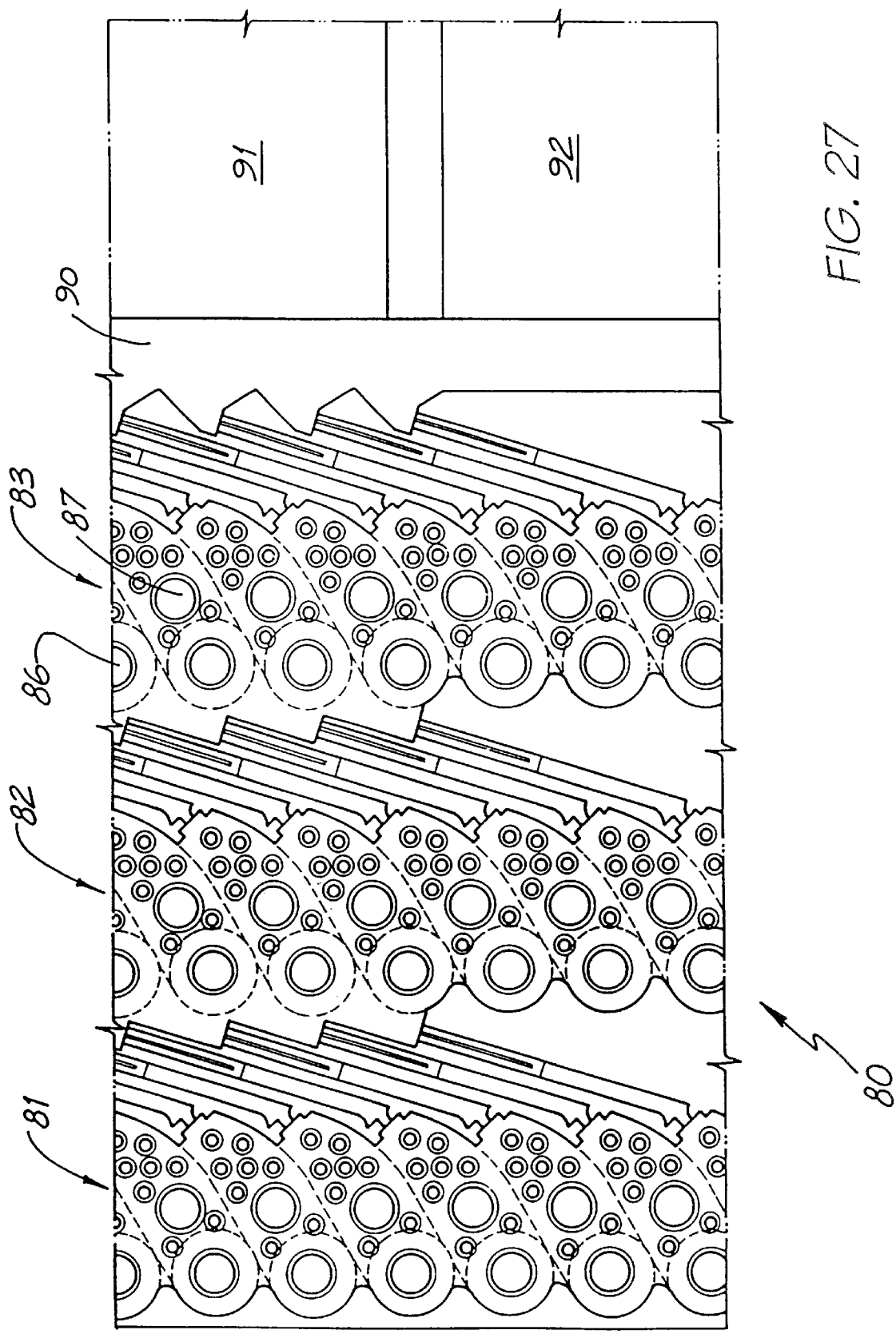
FIG. 27 illustrates a part of an array view of a printhead as constructed in accordance with the principles of the present invention.

Turning now to FIG. 27, there is illustrated a portion 80 of a full color printhead which is divided into three series of nozzles 81, 82 and 83. Each series can supply a separate color via means of a corresponding ink supply channel. Each series is further subdivided into two subrows 86, 87 with the relevant nozzles of each subrow being fired simultaneously with one subrow being fired a predetermined time after a second subrow such that a line of ink drops is formed on a page.

As illustrated in FIG. 27 the actuators are formed in a curved relationship with respect to the main nozzle access so as to provide for a more compact packing of the nozzles. Further, the block portion (18) of FIG. 6 is formed in the wall of an adjacent series with the block portion of the row 83 being formed in a separate guide rail 90 provided as an abutment surface for the TAB strip when it is abutted against the guide rail 90 so as to provide for an accurate registration of the tab strip with respect to the bond pads 91, 92 which are provided along the length of the printhead so as to provide for low impedance driving of the actuators.

Figure 28:
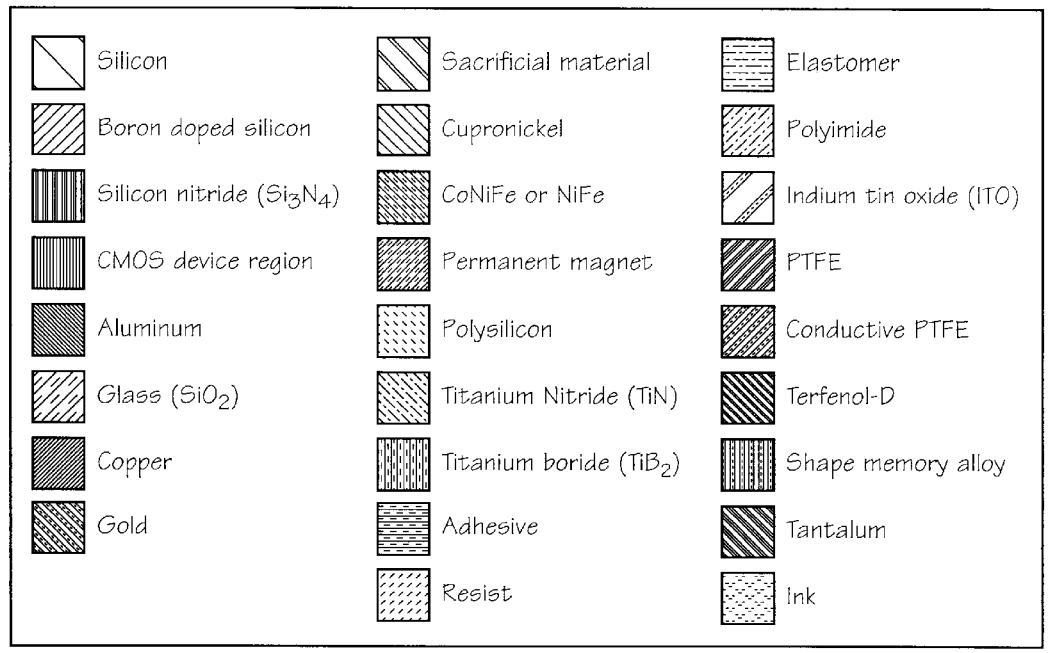
FIG. 28 provides a legend of the materials indicated in FIGS. 29 to 47.
Figure 29:
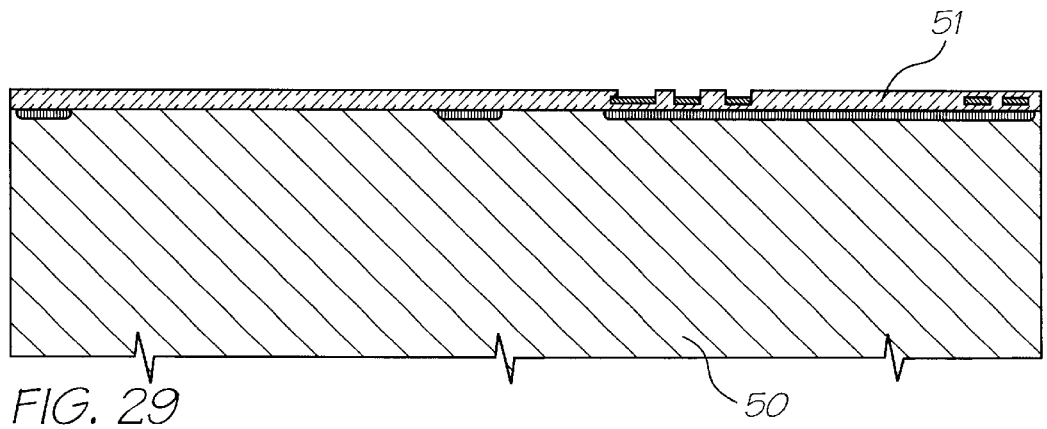
FIG. 29 shows a sectional side view of an initial manufacturing step of an ink jet printhead nozzle showing a silicon wafer layer and an electrical circuitry layer.
Figure 30:
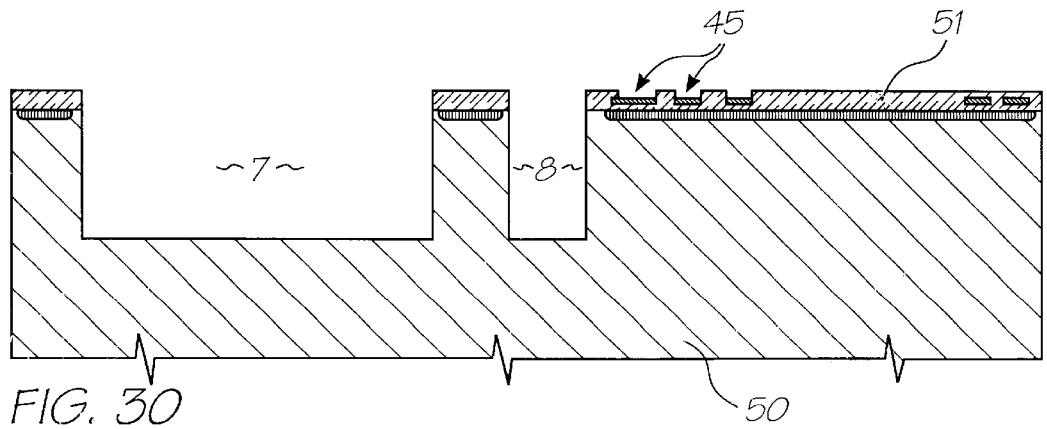
FIG. 30 shows a step of etching the silicon wafer layer.
Figure 31:
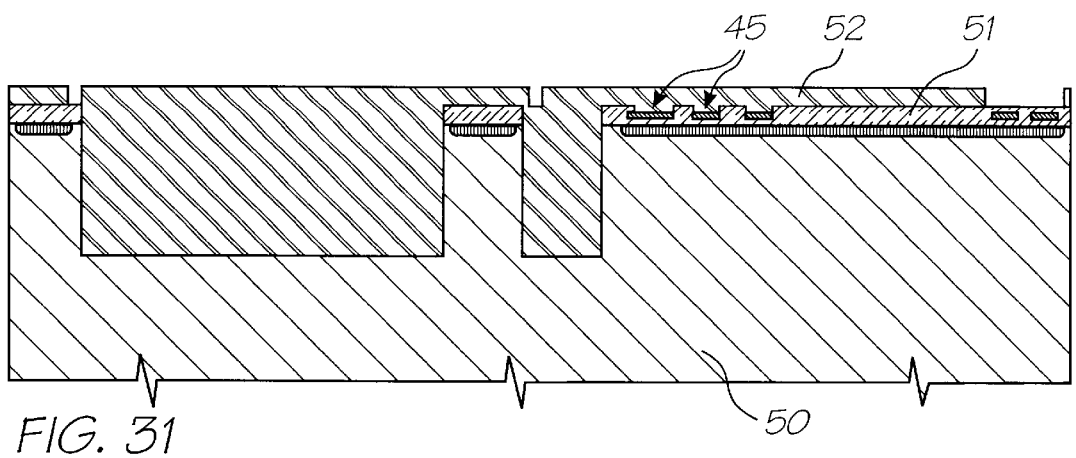
FIG. 31 shows a step of etching a sacrificial layer.
Figure 32:
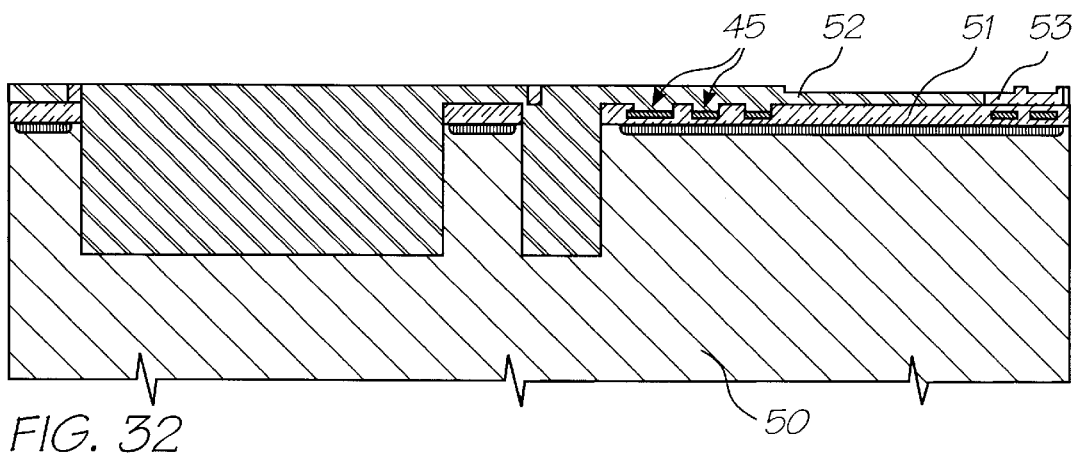
FIG. 32 shows a step of further etching the sacrificial material layer.
Figure 33:
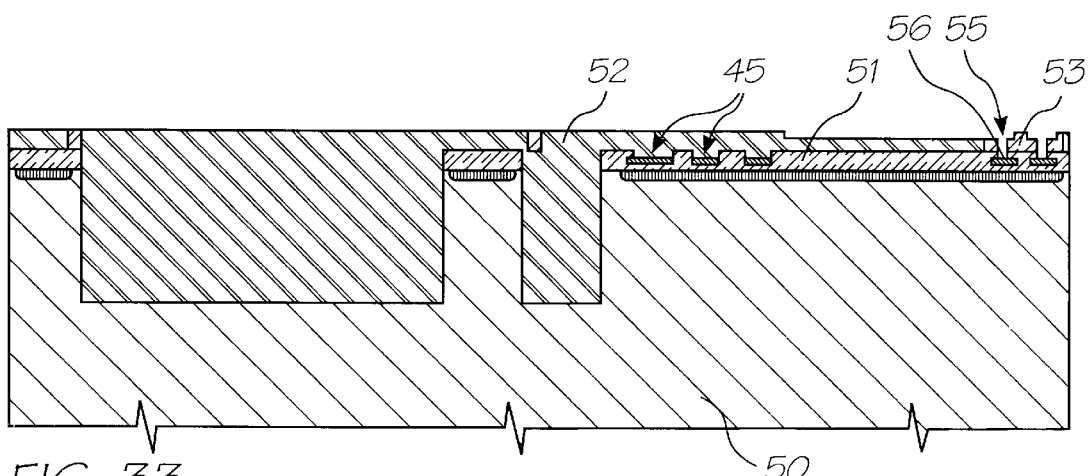
FIG. 33 shows a step of etching a glass layer.

One form of detailed manufacturing process which can be used to fabricate monolithic ink jet print heads operating in accordance with the principles taught by the present embodiment can proceed utilizing the following steps:

1. Using a double sided polished wafer 50, complete drive transistors, data distribution, and timing circuits using a 0.5 micron, one poly, 2 metal CMOS process to form layer 51. This step is shown in FIG. 29. For clarity, these diagrams may not be to scale, and may not represent a cross section though any single plane of the nozzle. FIG. 28 is a key to representations of various materials in these manufacturing diagrams, and those of other cross referenced ink jet configurations.
2. Etch oxide down to silicon or aluminum using Mask 1. This mask defines the pit 45 underneath the paddle, the anti-wicking pits at the actuator entrance to the nozzle chamber, as well as the edges of the print heads chip.
3. Etch silicon 50 to a depth of 20 microns using etched oxide as a mask. The sidewall slope of this etch is not critical (60 to 90 degrees is acceptable), so standard trench etchers can be used. This step is shown in FIG. 30.
4. Deposit 23 microns of sacrificial material 52 (e.g. polyimide or aluminum). Planarize to a thickness of 3 microns over the chip surface using CMP.
5. Etch the sacrificial layer 52 using Mask 2, which defines the nozzle walls and actuator anchor. This step is shown in FIG. 31.
6. Deposit 3 microns of PECVD glass 53 and planarize using CMP.
7. Etch the sacrificial material 52 to a depth of 1.1 microns, and glass 53 to a depth of at least 1.1 microns, using Mask 3. This mask defined the lower heater. This step is shown in FIG. 32.
8. Etch the glass layer 53 down to aluminum 56 using Mask 4, defining heater vias. This step is shown in FIG. 33.
9. Deposit 3 microns of heater material 57 (e.g. cupronickel [Cu: 60%, Ni: 40%] or TiN). If cupronickel, then deposition can consist of three steps—a thin anti-corrosion layer of, for example, TiN, followed by a seed layer, followed by electroplating of the cupronickel.

Figure 34:
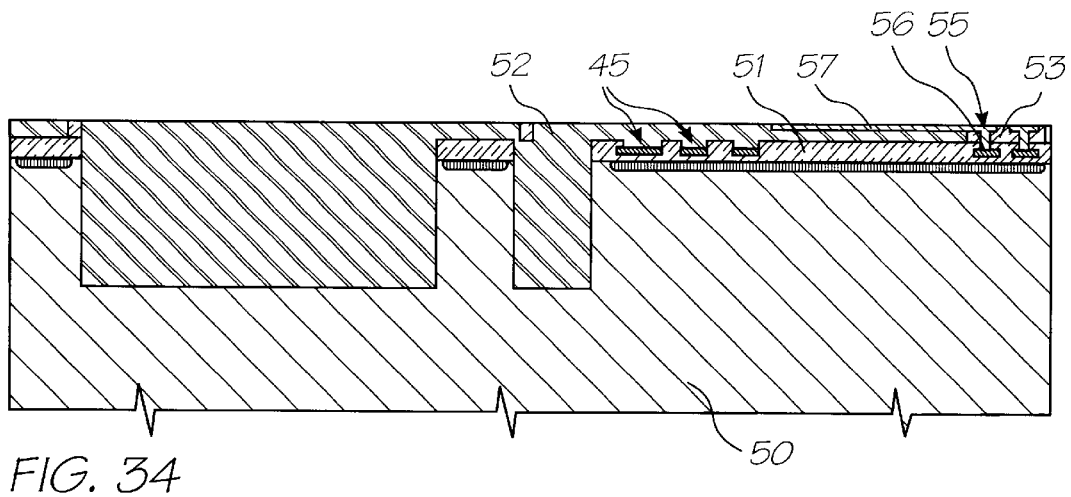
FIG. 34 shows a step of depositing and planarizing a first heater material layer.
Figure 35:
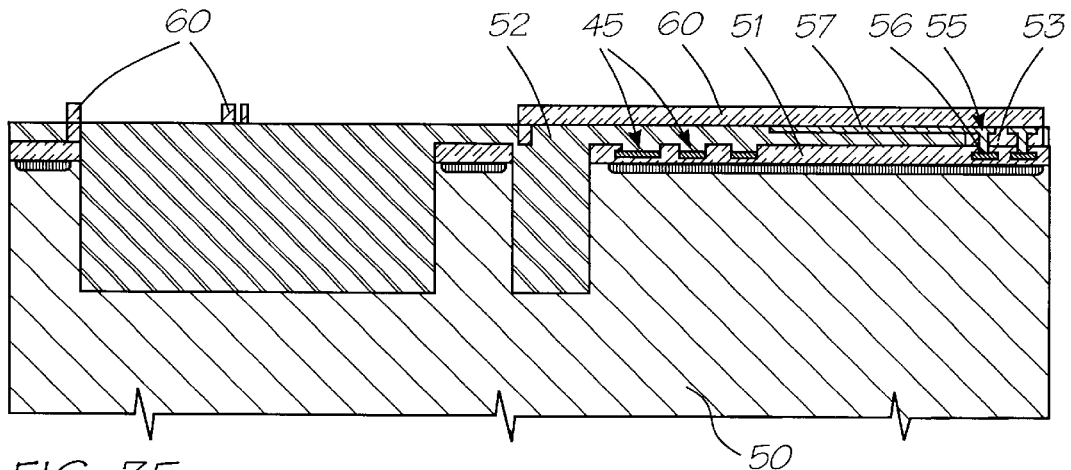
FIG. 35 shows a step of depositing and etching a glass layer.
Figure 36:
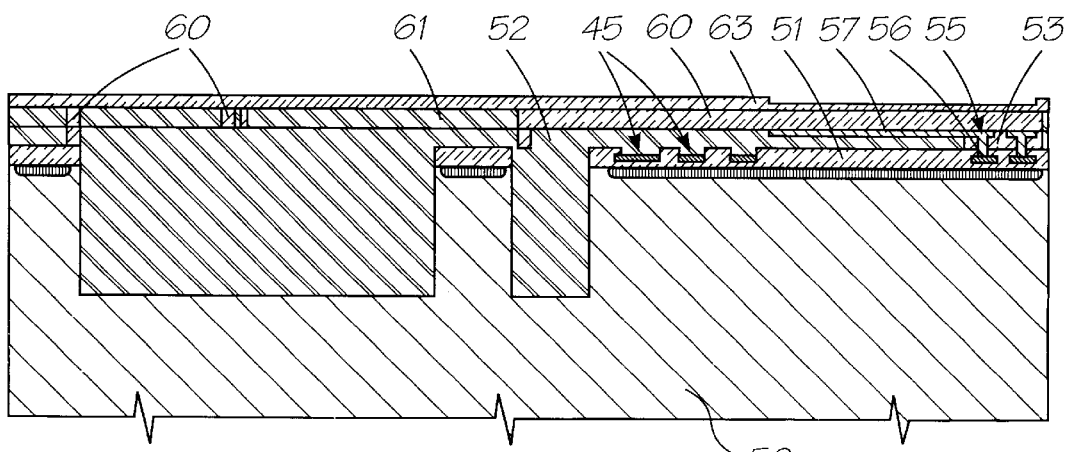
FIG. 36 shows a step of etching a further glass layer.
Figure 37:
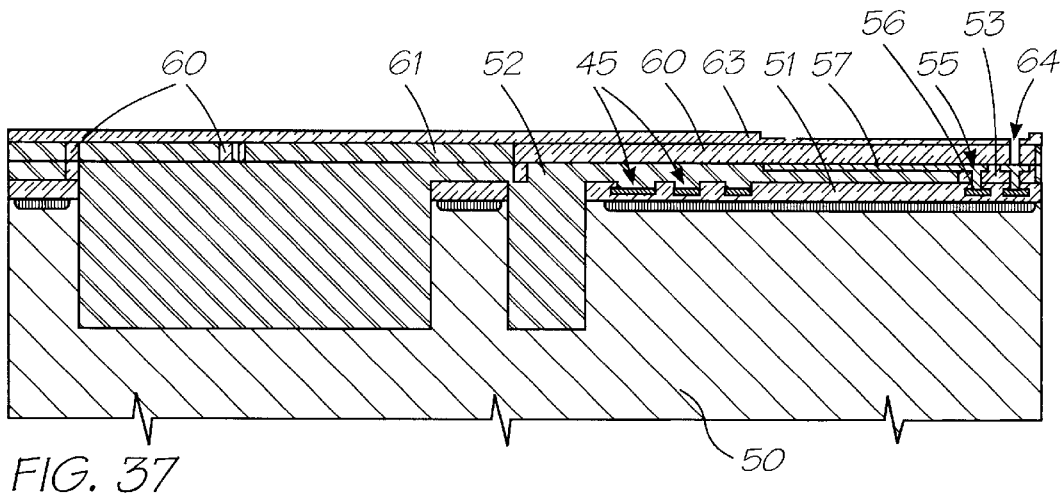
FIG. 37 shows a step of further etching the further glass layer.
Figure 38:
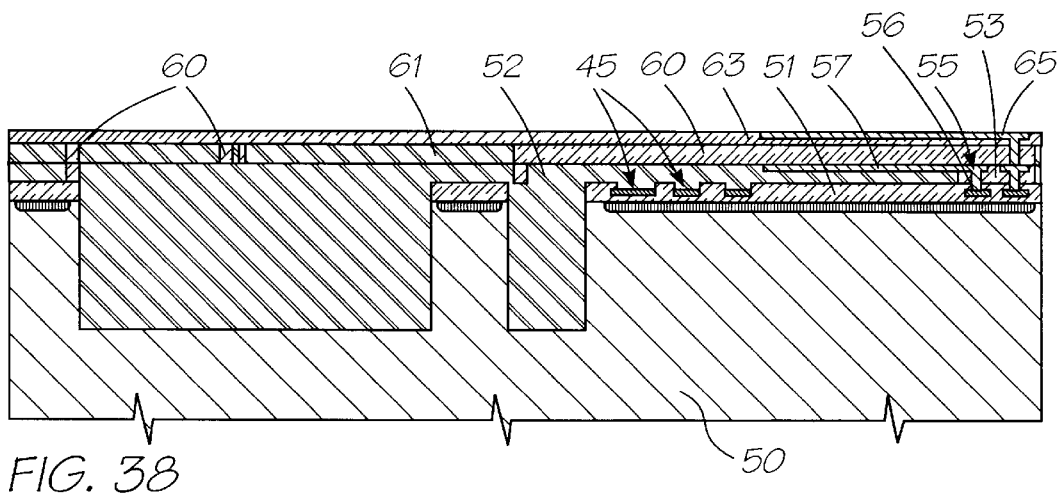
FIG. 38 shows a step of depositing a second heater material layer.
Figure 39:
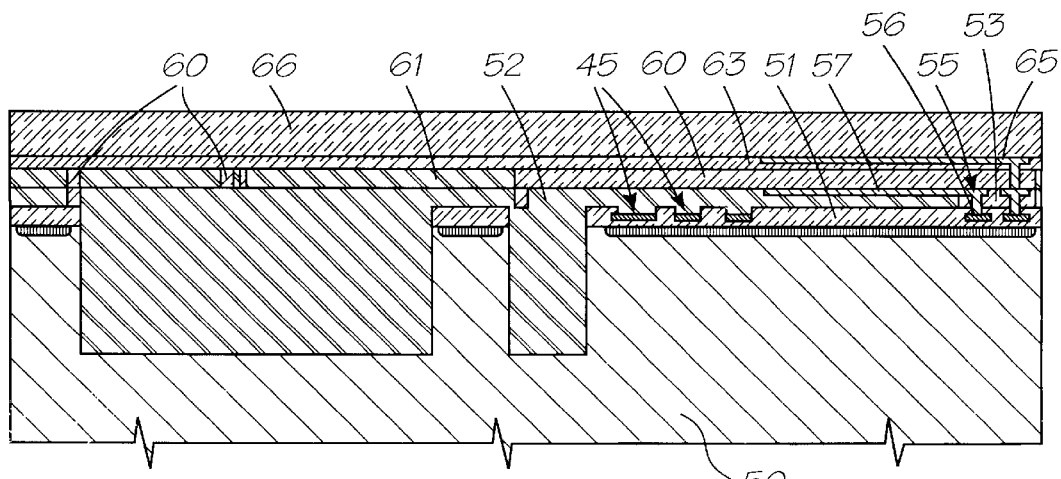
FIG. 39 shows a step of depositing yet a further glass layer.
Figure 40:
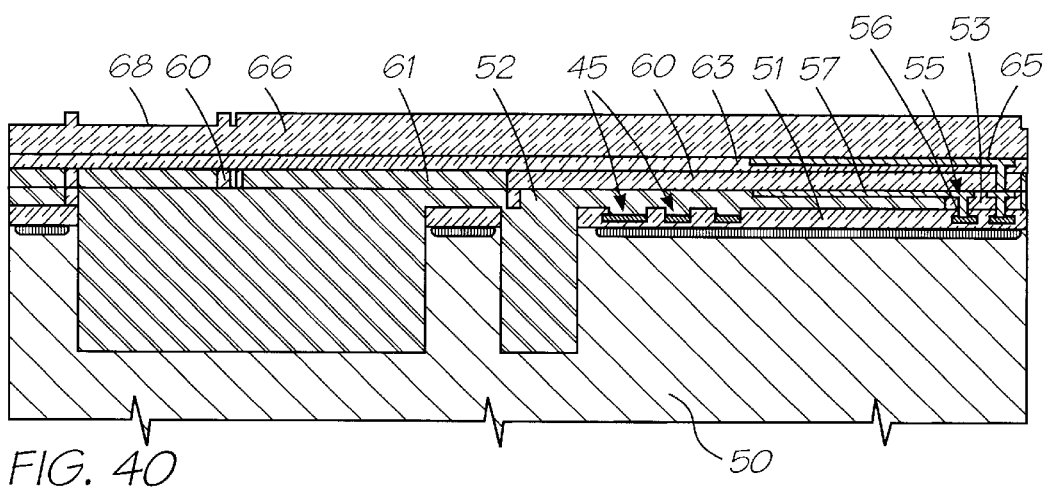
FIG. 40 shows a step of etching said yet further glass layer.
Figure 41:
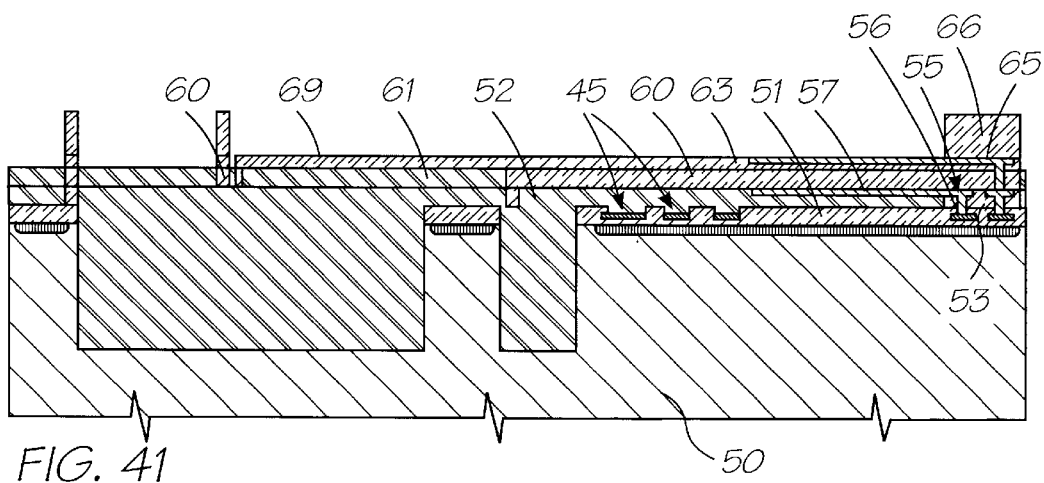
FIG. 41 shows a step of further etching said yet further glass layer.
Figure 42:
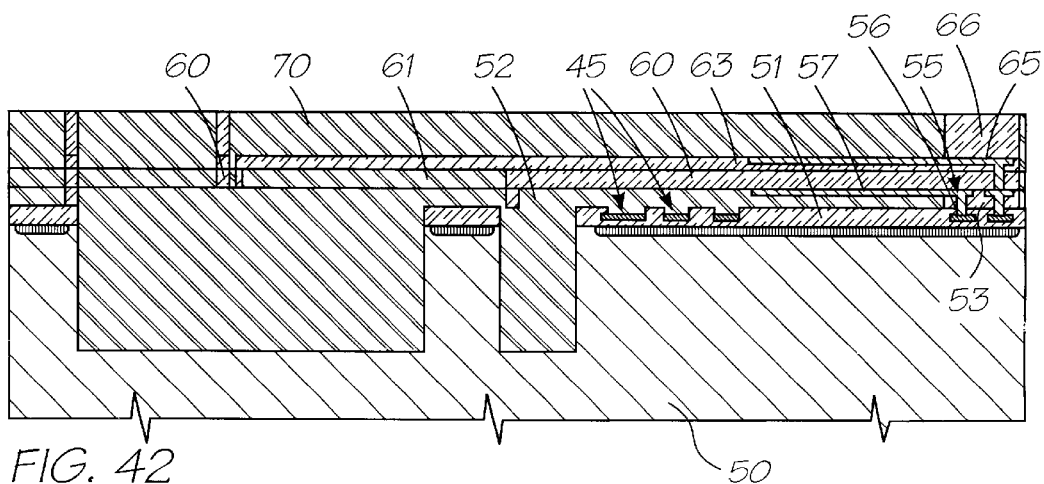
FIG. 42 shows a step of depositing a further sacrificial material layer.
Figure 43:
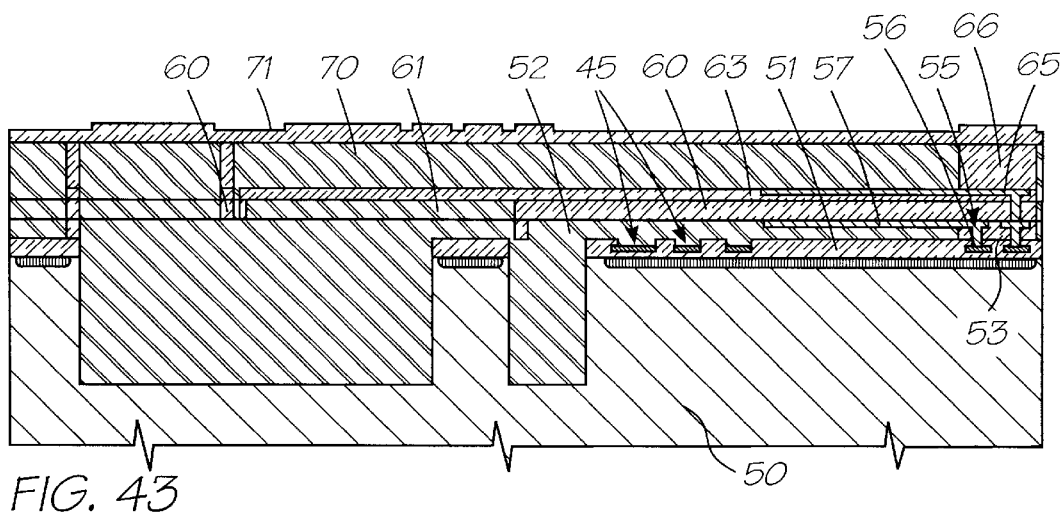
FIG. 43 shows a step of depositing and etching a final glass layer.
Figure 44:
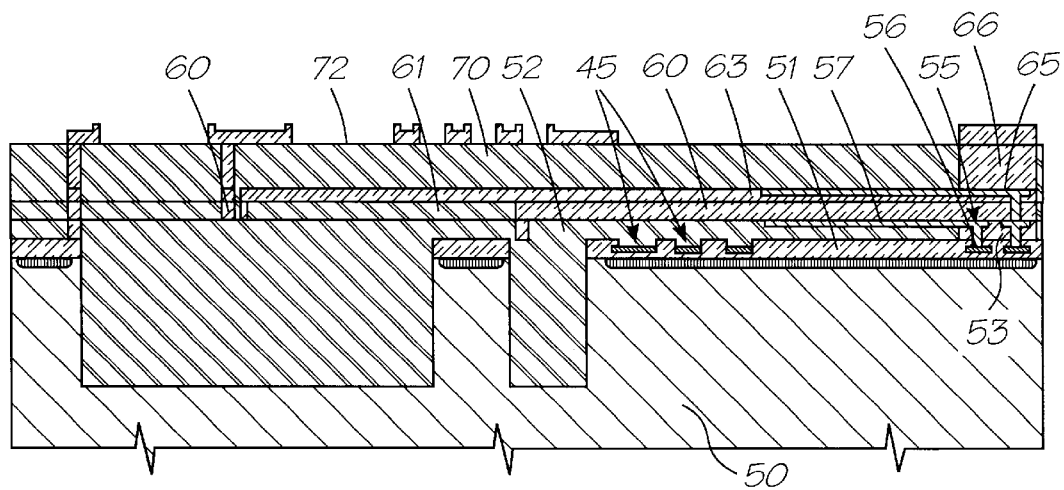
FIG. 44 shows a step of further etching the final glass layer.

10. Planarize down to the sacrificial layer 52 using CMP. Steps 7 to 10 form a 'dual damascene' process. This step is shown in FIG. 34.
11. Deposit 3 microns of PECVD glass 60 and etch using Mask 5. This mask defines the actuator arm and the second layer of the nozzle chamber wall. This step is shown in FIG. 35.
12. Deposit 3 microns of sacrificial material 61 and planarize using CMP.
13. Deposit 2 microns of PECVD glass 63.
14. Etch the glass 63 to a depth of 1.1 microns, using Mask 6. This mask defined the upper heater. This step is shown in FIG. 36.
15. Etch the glass layer 63 down to heater material using Mask 7, defining the upper heater vias 64. This step is shown in FIG. 37.
16. Deposit 3 microns of the same heater material 65 as step 9.
17. Planarize down to the glass layer 63 using CMP. Steps 14 to 17 form a second dual damascene process. This step is shown in FIG. 38.
18. Deposit 7 microns of PECVD glass 66. This step is shown in FIG. 39.
19. Etch glass 66 to a depth of 2 microns using Mask 8 as shown at 68. This mask defines the paddle, actuator, actuator anchor, as well as the nozzle walls. This step is shown in FIG. 40.
20. Etch glass 66 to a depth of 7 microns (stopping on sacrificial material 61 in exhaust gasses) using Mask 9 as shown at 69. This mask defines the nozzle walls and actuator anchor. This step is shown in FIG. 41.
21. Deposit 9 microns of sacrificial material 70 and planarize down to glass 66 using CMP. This step is shown in FIG. 42.
22. Deposit 3 microns of PECVD glass 71.
23. Etch glass 71 to a depth of 1 micron using Mask 10, which defines the nozzle rims. This step is shown in FIG. 43.
24. Etch glass 71 down to the sacrificial layer 70 (3 microns) using Mask 11, defining the nozzles and the nozzle chamber roof. This step is shown in FIG. 44.
25. Wafer probe. All electrical connections are complete at this point, bond pads are accessible, and the chips are not yet separated.
26. Back-etch silicon wafer to within approximately 15 microns of the front surface using Mask 8.

Figure 45:
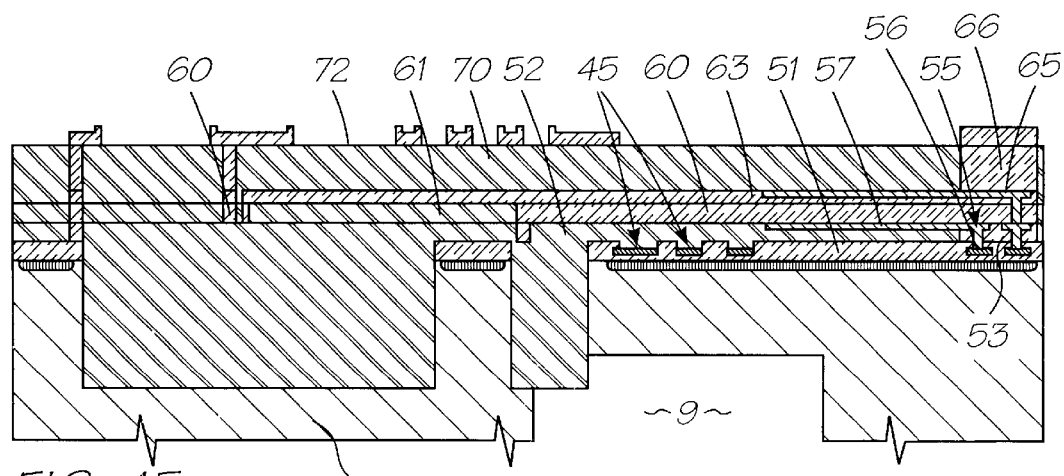
FIG. 45 shows a step back etching the silicon wafer layer.
Figure 46:
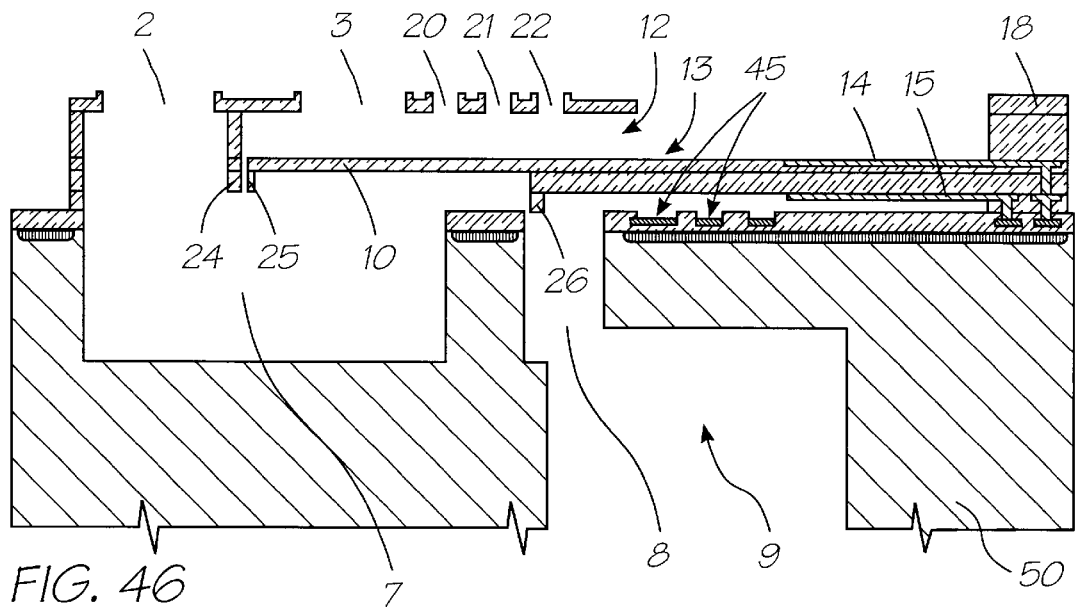
FIG. 46 shows a step of etching the sacrificial material layers.
Figure 47:
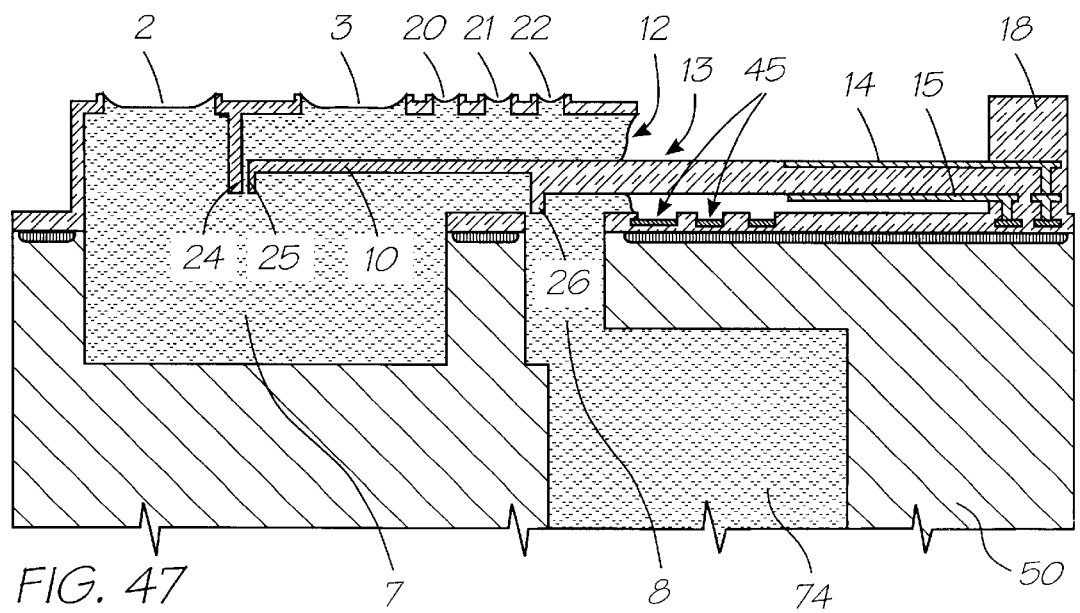
FIG. 47 shows a step of filling the completed ink jet nozzle with ink.

This mask defines the ink inlets 9 which are etched through the wafer. The wafer is also diced by this etch. This etch can be achieved with, for example, an ASE Advanced Silicon Etcher from Surface Technology Systems. This step is shown in FIG. 45.
27. Etch the sacrificial material. The nozzle chambers are cleared, the actuators freed, and the chips are separated by this etch. This step is shown in FIG. 46.
28. Mount the print heads in their packaging, which may be a molded plastic former incorporating ink channels which supply the appropriate color ink to the ink inlets at the back of the wafer.
29. Connect the print heads to their interconnect systems. For a low profile connection with minimum disruption of airflow, TAB may be used. Wire bonding may also be used if the printer is to be operated with sufficient clearance to the paper.
30. Hydrophobize the front surface of the print heads.
31. Fill the completed print heads with ink 74 and test them. A filled nozzle is shown in FIG. 47.

It would therefore be evident that the preferred embodiment provides for a compact form of manufacture of an inkjet printhead which includes a dual nozzle single actuator system.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table above under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the in the table under the heading Cross References to Related Applications.

Other ink jet configurations can readily be derived from these forty-five examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | | | | |
|---|---|---|---|---|---|---|---|
| | Description | | Advantages | | Disadvantages | | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | * * * * * | Large force generated Simple construction No moving parts Fast operation Small chip area required for actuator | * * * * * * * * | High power Ink carrier limited to water Low efficiency High temperatures required High mechanical stress Unusual materials required Large drive transistors Cavitation causes, actuator failure Kogation reduces bubble formauon Large print heads are difficult to fabricate | * * * | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | * * * * | Low power consumption Many ink types can be used Fast operation High efficiency | * * * * * | Very large area required for actuator Difficult to integrate with electronics High voltage drive transistors required Full pagewidth print heads impractical due to actuator size Requires electrical poling in high field strengths during manufacture | * * * * * | Kyser et al U.S. Pat. No. 3,946,398 Zoltan U.S. Pat. No. 3,683,212 1973 Stemme U.S. Pat. No. 3,747,120 Epson Stylus Tektronix IJ04 |

-continued

ACTUATOR MECHANISM (APPLIED ONLY TO SELECTED INK DROPS)

| | Description | Advantages | Disadvantages | Examples |
|---|---|---|---|---|
| Electro-strictive | An electric field is used to activate electrostriction in relaxor materials such as lead lanthanum zirconate titanate (PLZT) or lead magnesium niobate (PMN). | * Low power consumption<br>* Many ink types can be used<br>* Low thermal expansion<br>* Electric field strength required (approx. 3.5 V/$\mu$m) can be generated without difficulty<br>* Does not require electrical poling | * Low maximum strain (approx. 0.01%)<br>* Large area required for actuator due to low strain<br>* Response speed is marginal (~10 $\mu$s)<br>* High voltage drive transistors required<br>* Full pagewidth print heads impractical due to actuator size | * Seiko Epson, Usui et all JP 253401/96<br>* IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | * Low power consumption<br>* Many ink types can be used<br>* Fast operation (< 1 $\mu$s)<br>* Relatively high longitudinal strain<br>* High efficiency<br>* Electric field strength of around 3 V/$\mu$m can be readily provided | * Difficult to integrate with electronics<br>* Unusual materials such as PLZSnT are required<br>* Actuators require a large area | * IJ04 |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | * Low power consumption<br>* Many ink types can be used<br>* Fast operation | * Difficult to operate electrostatic devices in an aqueous environment<br>* The electrostatic actuator will normally need to be separated from the ink<br>* Very large area required to achieve high forces<br>* High voltage drive transistors may be required<br>* Full pagewidth print heads are not competitive due to actuator size | * IJ02, IJ04 |
| Electro static pull on ink | A strong electric field is applied to the ink, whereupon electrostatic attraction accelerates the ink towards the print medium. | * Low current consumption<br>* Low temperature | * High voltage required<br>* May be damaged by sparks due to air breakdown<br>* Required field strength increases as the drop size decreases<br>* High voltage drive transistors required<br>* Electrostatic field attracts dust | * 1989 Saito et al, U.S. Pat. No. 4,799,068<br>* 1989 Miura et al, U.S. Pat. No. 4,810,954<br>* Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | * Low power consumption<br>* Many ink types can be used<br>* Fast operation<br>* High efficiency<br>* Easy extension from single nozzles to pagewidth print heads | * Complex fabrication<br>* Permanent magnetic material such as Neodymium Iron Boron (NdFeB) required.<br>* High local currents required<br>* Copper metalization should be used for long electromigration lifetime and low resistivity<br>* Pigmented inks are usually infeasible | * IJ07, IJ10 |

-continued

ACTUATOR MECHANISM (APPLIED ONLY TO SELECTED INK DROPS)

| | Description | Advantages | Disadvantages | Examples |
|---|---|---|---|---|
| | | | * Operating temperature limited to the Curie temperature (around 540 K) | |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | * Low power consumption<br>* Many ink types can be used<br>* Fast operation<br>* High efficiency<br>* Easy extension from single nozzles to pagewidth print heads | * Complex fabrication<br>* Materials not usually present in a CMOS fab such as NiFe, CoNiFe, or CoFe are required<br>* High local currents required<br>* Copper metalization should be used for long electromigration lifetime and low resistivity<br>* Electroplating is required<br>* High saturation flux density is required (2.0–2.1 T is achievable with CoNiFe [1]) | IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | * Low power consumption<br>* Many ink types can be used<br>* Fast operation<br>* High efficiency<br>* Easy extension from single nozzles to pagewidth print heads | * Force acts as a twisting motion<br>* Typically, only a quarter of the solenoid length provides force in a useful direction<br>* High local currents required<br>* Copper metalization should be used for long electromigration lifetime and low resistivity<br>* Pigmented inks are usually infeasible | IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | * Many ink types can be used<br>* Fast operation<br>* Easy extension from single nozzles to pagewidth print heads<br>* High force is available | * Force acts as a twisting motion<br>* Unusual materials such as Terfenol-D are required<br>* High local currents required<br>* Copper metalization should be used for long electromigration lifetime and low resistivity<br>* Pre-stressing may be required | Fischenbeck, U.S. Pat. No. 4,032,929<br>IJ25 |
| Surface tension reduction | Ink under positive pressure is held in a nozzle by surface tension. The surface tension of the ink is reduced below the bubble threshold, causing the ink to egress from the nozzle. | * Low power consumption<br>* Simple construction<br>* No unusual materials required in fabrication<br>* High efficiency<br>* Easy extension from single nozzles to pagewidth print heads | * Requires supplementary force to effect drop separation<br>* Requires special ink surfactants<br>* Speed may be limited by surfactant properties | Silverbrook, EP 0771 658 A2 and related patent applications |
| Viscosity reduction | The ink viscosity is locally reduced to select which drops are to be ejected. A | * Simple construction<br>* No unusual materials required in fabrication | * Requires supplementary force to effect drop separation | Silverbrook, EP 0771 658 A2 and related patent applications |

-continued

ACTUATOR MECHANISM (APPLIED ONLY TO SELECTED INK DROPS)

| | Description | Advantages | Disadvantages | Examples |
|---|---|---|---|---|
| | viscosity reduction can be achieved electrothermally with most inks, but special inks can be engineered for a 100:1 viscosity reduction. | * Easy extension from single nozzles to pagewidth print heads. | * Requires special ink viscosity properties<br>* High speed is difficult to achieve<br>* Requires oscillating ink pressure<br>* A high temperature difference (typically 80 degrees) is required | |
| Acoustic | An acoustic wave is generated and focused upon the drop ejection region. | * Can operate without a nozzle plate | * Complex drive circuitry<br>* Complex fabrication<br>* Low efficiency<br>* Poor control of drop position<br>* Poor control of drop volume | * 1993 Hadimioglu et al, EUP 550,192<br>* 1993 Elrod et al, EUP 572,220 |
| Thermo-elastic bend actuator | An actuator which relies upon differential thermal expansion upon Joule heating is used. | * Low power consumption<br>* Many ink types can be used<br>* Simple planar fabrication<br>* Small chip area required for each actuator<br>* Fast operation<br>* High efficiency<br>* CMOS compatible voltages and currents<br>* Standard MEMS processes can be used<br>* Easy extension from single nozzles to pagewidth print heads | * Efficient aqueous operation requires a thermal insulator on the hot side<br>* Corrosion prevention can be difficult<br>* Pigmented inks may be infeasible, as pigment particles may jam the bend actuator | * IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |
| High CTE thermal elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 $\mu$m long PTFE bend actuator with polysilicon heater and 15 mW power input can provide 180 $\mu$N force and 10 $\mu$m deflection. Actuator motions include:<br>Bend<br>Push<br>Buckle<br>Rotate | * High force can be generated<br>* Three methods of PTFE deposition are under development: chemical vapor deposition (CVD), spin coating, and evaporation<br>* PTFE is a candidate for low dielectric constant insulation in ULSI<br>* Very low power consumption<br>* Many ink types can be used<br>* Simple planar fabrication<br>* Small chip area required for each actuator<br>* Fast operation<br>* High efficiency<br>* CMOS compatible voltages and currents<br>* Easy extension from single nozzles to pagewidth print heads | * Requires special material (e.g. PTFE)<br>* Requires a PTFE deposition process, which is not yet standard in ULSI fabs<br>* PTFE deposition cannot be followed with high temperature (above 350° C.) processing<br>* Pigmented inks may be infeasible, as pigment particles may jam the bend actuator | * IJ09, IJ17, IJ18, IJ20, IJ21, IJ22, IJ23, IJ24, IJ27, IJ28, IJ29, IJ30, IJ31, IJ42, IJ43, IJ44 |

-continued

ACTUATOR MECHANISM (APPLIED ONLY TO SELECTED INK DROPS)

| | Description | Advantages | Disadvantages | Examples |
|---|---|---|---|---|
| Conductive polymer thermoelastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: Carbon nanotubes Metal fibers Conductive polymers such as doped polythiophene Carbon granules | * High force can be generated<br>* Very low power consumption<br>* Many ink types can be used<br>* Simple planar fabrication<br>* Small chip area required for each actuator<br>* Fast operation<br>* High efficiency<br>* CMOS compatible voltages and currents<br>* Easy extension from single nozzles to pagewidth print heads | * Requires special materials development (High CTE conductive polymer)<br>* Requires a PTFE deposition process, which is not yet standard in ULSI fabs<br>* PTFE deposition cannot be followed with high temperature (above 350° C.) processing<br>* Evaporation and CVD deposition techniques cannot be used<br>* Pigmented inks may be infeasible, as pigment particles may jam the bend actuator | * IJ24 |
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | * High force is available (stresses of hundreds of MPa)<br>* Large strain is available (more than 3%)<br>* High corrosion resistance<br>* Simple construction<br>* Easy extension from single nozzles to pagewidth print heads<br>* Low voltage operation | * Fatigue limits maximum number of cycles<br>* Low strain (1%) is required to extend fatigue resistance<br>* Cycle rate limited by heat removal<br>* Requires unusual materials (TiNi)<br>* The latent heat of transformation must be provided<br>* High current operation<br>* Requires pre-stressing to distort the martensitic state | * IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | * Linear Magnetic actuators can be constructed with high thrust, long travel, and high efficiency using planar semiconductor fabrication techniques<br>* Long actuator travel is available<br>* Medium force is available<br>* Low voltage operation | * Requires unusual semiconductor materials such as soft magnetic alloys (e.g. CoNiFe)<br>* Some varieties also require permanent magnetic materials such as Neodymium iron boron (NdFeB)<br>* Requires complex multi-phase drive circuitry<br>* High current operation | * IJ12 |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient | * Simple operation<br>* No external fields required<br>* Satellite drops can be avoided if drop velocity is less than 4 m/s | * Drop repetition rate is usually limited to around 10 kHz. However, this is not fundamental to the method, but is related to the refill | * Thermal ink jet<br>* Piezoelectric ink jet<br>* IJ01, IJ02, IJ03, IJ04, IJ05, IJ06, IJ07, IJ09, IJ11, IJ12, IJ14, IJ16, IJ20, IJ22, IJ23, |

-continued

BASIC OPERATION MODE

| | Description | Advantages | Disadvantages | Examples |
|---|---|---|---|---|
| | velocity to overcome the surface tension. | * Can be efficient, depending upon the actuator used | method normally used<br>* All of the drop kinetic energy must be provided by the actuator<br>* Satellite drops usually form if drop velocity is greater than 4.5 m/s | IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | * Very simple print head fabrication can be used<br>* The drop selection means does not need to provide the energy required to separate the drop from the nozzle | * Requires close proximity between the print head and the print media or transfer roller<br>* May require two print heads printing alternate rows of the image<br>* Monolithic color print heads are difficult | * Silverbrook, EP 0771 658 A2 and related patent applications |
| Electrostatic pull on ink | The drops to be printed are selected by some manner (e.g. thermally induced surface tension reduction of pressurized ink). Selected drops are separated from the ink in the nozzle by a strong electric field. | * Very simple print head fabrication can be used<br>* The drop selection means does not need to provide the energy required to separate the drop from the nozzle | * Requires very high electrostatic field<br>* Electrostatic field for small nozzle sizes is above air breakdown<br>* Electrostatic field may attract dust | * Silverbrook, EP 0771 658 A2 and related patent applications<br>* Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | * Very simple print head fabrication can be used<br>* The drop selection means does not need to provide the energy required to separate the drop from the nozzle | * Requires magnetic ink<br>* Ink colors other than black are difficult<br>* Requires very high magnetic fields | * Silverbrook, EP 0771 658 A2 and related patent applications |
| Shutter | The actuator moves a shutter to block ink flow to the nozzle. The ink pressure is pulsed at a multiple of the drop ejection frequency. | * High speed (>50 kHz) operation can be achieved due to reduced refill time<br>* Drop timing can be very accurate<br>* The actuator energy can be very low | * Moving parts are required<br>* Requires ink pressure modulator<br>* Friction and wear must be considered<br>* Stiction is possible | * IJ13, IJ17, IJ21 |
| Shuttered grill | The actuator moves a shutter to block ink flow through a grill to the nozzle. The shutter movement need only be equal to the width of the grill holes. | * Actuators with small travel can be used<br>* Actuators with small force can be used<br>* High speed (>50 kHz) operation can be achieved | * Moving parts are required<br>* Requires ink pressure modulator<br>* Friction and wear must be considered<br>* Stiction is possible | * IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | * Extremely low energy operation is possible<br>* No heat dissipation problems | * Requires an external pulsed magnetic field<br>* Requires special materials for both the actuator and the ink pusher<br>* Complex construction | * IJ10 |

| | | AUXILIARY MECHANISM (APPLIED TO ALL NOZZLES) | | |
|---|---|---|---|---|
| | Description | Advantages | Disadvantages | Examples |
| None | The actuator directly fires the ink drop, and there is no external field or other mechanism required. | * Simplicity of construction<br>* Simplicity of operation<br>* Small physical size | * Drop ejection energy must be supplied by individual nozzle actuator | * Most ink jets, including piezoelectric and thermal bubble.<br>* IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | * Oscillating ink pressure can provide a refill pulse, allowing higher operating speed<br>* The actuators may operate with much lower energy<br>* Acoustic lenses can be used to focus the sound on the nozzles | * Requires external ink pressure oscillator<br>* Ink pressure phase and amplitude must be carefully controlled<br>* Acoustic reflections in the ink chamber must be designed for | * Silverbrook, EP 0771 658 A2 and related patent applications<br>* IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | * Low power<br>* High accuracy<br>* Simple print head construction | * Precision assembly required<br>* Paper fibers may cause problems<br>* Cannot print on rough substrates | * Silverbrook, EP 0771 658 A2 and related patent applications |
| Transfer roller | Drops are printed to a transfer roller instead of straight to the print medium. A transfer roller can also be used for proximity drop separation. | * High accuracy<br>* Wide range of print substrates can be used<br>* Ink can be dried on the transfer roller | * Bulky<br>* Expensive<br>* Complex construction | * Silverbrook, EP 0771 658 A2 and related patent applications<br>* Tektronix hot melt piezoelectric ink jet<br>* Any of the IJ series |
| Electro-static | An electric field is used to accelerate selected drops towards the print medium. | * Low power<br>* Simple print head construction | * Field strength required for separation of small drops is near or above air breakdown | * Silverbrook, EP 0771 658 A2 and related patent applications<br>* Tone-Jet |
| Direct magnetic field | A magnetic field is used to accelerate selected drops of magnetic ink towards the print medium. | * Low power<br>* Simple print head construction | * Requires magnetic ink<br>* Requires strong magnetic field | * Silverbrook, EP 0771 658 A2 and related patent applications |
| Cross magnetic field | The print head is placed in a constant magnetic field. The Lorenz force in a current carrying wire is used to move the actuator. | * Does not require magnetic materials to be integrated in the print head manufacturing process | * Requires external magnet<br>* Current densities may be high, resulting in electromigration problems | * IJ06, IJ16 |
| Pulsed magnetic field, | A pulsed magnetic field is used to cyclically attract a paddle, which pushes on the ink. A small actuator moves a catch, which | * Very low power operation is possible<br>* Small print head size | * Complex print head construction<br>* Magnetic materials required in print head | * IJ10 |

-continued

AUXILIARY MECHANISM (APPLIED TO ALL NOZZLES)

| | Description | Advantages | Disadvantages | Examples |
|---|---|---|---|---|
| | selectively prevents the paddle from moving. | | | |

ACTUATOR AMPLIFICATION OR MODIFICATION METHOD

| | Description | Advantages | Disadvantages | Examples |
|---|---|---|---|---|
| None | No actuator mechanical amplification is used. The actuator directly drives the drop ejection process. | * Operational simplicity | * Many actuator mechanisms have insufficient travel, or insufficient force, to efficiently drive the drop ejection process | * Thermal Bubble Ink jet<br>* IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | * Provides greater travel in a reduced print head area | * High stresses are involved<br>* Care must be taken that the materials do not delaminate<br>* Residual bend resulting from high temperature or high stress during formation | * Piezoelectric<br>* IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | * Very good temperature stability<br>* High speed, as a new drop can be fired before heat dissipates<br>* Cancels residual stress of formation | * High stresses are involved<br>* Care must be taken that the materials do not delaminate | * IJ40, IJ41 |
| Reverse spring | The actuator loads a spring. When the actuator is turned off, the spring releases. This can reverse the force/distance curve of the actuator to make it compatible with the force/time requirements of the drop ejection. | * Better coupling to the ink | * Fabrication complexity<br>* High stress in the spring | * IJ05, IJ11 |
| Actuator stack | A series of thin actuators are stacked. This can be appropriate where actuators require high electric field strength, such as electrostatic and piezoelectric actuators. | * Increased travel<br>* Reduced drive voltage | * Increased fabrication complexity<br>* Increased possibility of short circuits due to pinholes | * Some piezoelectric ink jets<br>* IJ04 |
| Multiple actuators | Multiple smaller actuators are used simultaneously to move the ink. Each actuator need provide only a portion of the force required. | * Increases the force available from an actuator<br>* Multiple actuators can be positioned to control ink flow accurately | * Actuator forces may not add linearly, reducing efficiency | * IJ12, IJ13, IJ18, IJ20, IJ22, IJ28, IJ42, IJ43 |
| Linear Spring | A linear spring is used to transform a motion with small travel and high force into a longer travel, lower force motion. | * Matches low travel actuator with higher travel requirements<br>* Non-contact method of motion transformation | * Requires print head area for the spring | * IJ15 |

-continued

ACTUATOR AMPLIFICATION OR MODIFICATION METHOD

| | Description | Advantages | Disadvantages | Examples |
|---|---|---|---|---|
| Coiled actuator | A bend actuator is coiled to provide greater travel in a reduced chip area. | * Increases travel <br> * Reduces chip area <br> * Planar implementations are relatively easy to fabricate. | * Generally restricted to planar implementations due to extreme fabrication difficulty in other orientations. | * IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | * Simple means of increasing travel of a bend actuator | * Care must be taken not to exceed the elastic limit in the flexure area <br> * Stress distribution is very uneven <br> * Difficult to accurately model with finite element analysis | * IJ10, IJ19, IJ33 |
| Catch | The actuator controls a small catch. The catch either enables or disables movement of an ink pusher that is controlled in a bulk manner. | * Very low actuator energy <br> * Very small actuator size | * Complex construction <br> * Requires external force <br> * Unsuitable for pigmented inks | * IJ10 |
| Gears | Gears can be used to increase travel at the expense of duration. Circular gears, rack and pinion, ratchets, and other gearing methods can be used. | * Low force, low travel actuators can be used <br> * Can be fabricated using standard surface MEMS processes | * Moving parts are required <br> * Several actuator cycles are required <br> * More complex drive electronics <br> * Complex construction <br> * Friction, friction, and wear are possible | * IJ13 |
| Buckle plate | A buckle plate can be used to change a slow actuator into a fast motion. It can also convert a high force, low travel actuator into a high travel, medium force motion. | * Very fast movement achievable | * Must stay within elastic limits of the materials for long device life <br> * High stresses involved <br> * Generally high power requirement | * S. Hirata et al, "An Ink-jet Head Using Diaphragm Microactuator", Proc. IEEE MEMS, Feb. 1996, pp 418–423. <br> * IJ18, IJ27 |
| Tapered magnetic pole | A tapered magnetic pole can increase travel at the expense of force. | * Linearizes the magnetic force/distance curve | * Complex construction | * IJ14 |
| Lever | A lever and fulcrum is used to transform a motion with small travel and high force into a motion with longer travel and lower force. The lever can also reverse the direction of travel. | * Matches low travel actuator with higher travel requirements <br> * Fulcrum area has no linear movement, and can he used for a fluid seal | * High stress around the fulcrum | * IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | * High mechanical advantage <br> * The ratio of force to travel of the actuator can be matched to the nozzle requirements by varying the number of impeller vanes | * Complex construction <br> * Unsuitable for pigmented inks | * IJ28 |
| Acoustic lens | A refractive or diffractive (e.g. zone plate) acoustic lens is used to concentrate sound waves. | * No moving parts | * Large area required <br> * Only relevant for acoustic ink jets | * 1993 Hadimioglu et al, EUP 559,192 <br> * 1993 Elrod et al, EUP 572,220 |
| Sharp conductive | A sharp point is used to concentrate an | * Simple construction | * Difficult to fabricate using standard VLSI | * Tone-jet |

-continued

ACTUATOR AMPLIFICATION OR MODIFICATION METHOD

| | Description | Advantages | Disadvantages | Examples |
|---|---|---|---|---|
| point | electrostatic field. | | processes for a surface ejecting ink-jet<br>* Only relevant for electrostatic ink jets | |

ACTUATOR MOTION

| | Description | Advantages | Disadvantages | Examples |
|---|---|---|---|---|
| Volume expansion | The volume of the actuator changes, pushing the ink in all directions. | ◆ Simple construction in the case of thermal ink jet | ◆ High energy is typically required to achieve volume expansion. This leads to thermal stress, cavitation, and kogation in thermal ink jet implementations | ◆ Hewlett-Packard Thermal Ink jet<br>◆ Canon Bubblejet |
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ IJ01, IJ02, IJ04, IJ07, IJ11, IJ14 |
| Parallel to chip surface | The actuator moves parallel to the print head surface. Drop ejection may still be normal to the surface. | ◆ Suitable for planar fabrication | ◆ Fabrication complexity<br>◆ Friction<br>◆ Stiction | ◆ IJ12, IJ13, IJ15, IJ33, , IJ34, IJ35, IJ36 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins U.S. Pat. No. 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to | ◆ IJ36, IJ37, IJ38 |

ACTUATOR MOTION

| | Description | Advantages | Disadvantages | Examples |
|---|---|---|---|---|
| | energized. | | equivalent single bend actuators. | |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck U.S. Pat. No. 4,584,590 |
| Radial con-striction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process<br>◆ Small area required, therefore low cost | ◆ Difficult to fabricate for non-planar devices<br>◆ Poor out-of-plane stiffness | ◆ IJ17, IJ21, IJ34, IJ35 |
| Bow | The actuator bows (or buckles) in the middle when energized. | ◆ Can increase the speed of travel<br>◆ Mechanically rigid | ◆ Maximum travel is constrained<br>◆ High force required | ◆ IJ16, IJ18, IJ27 |
| Push-Pull | Two actuators control a shutter. One actuator pulls the shutter, and the other pushes it. | ◆ The structure is pinned at both ends, so has a high out-of-plane rigidity | ◆ Not readily smtable for ink jets which directly push the ink | ◆ IJ18 |
| Curl inwards | A set of actuators curl inwards to reduce the volume of ink that they enclose. | ◆ Good fluid flow to the region behind the actuator increases efficiency | ◆ Design complexity | ◆ IJ20, IJ42 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ IJ43 |
| Iris | Multiple vanes enclose a volume of ink. These simultaneously rotate, reducing the volume between the vanes. | ◆ High efficiency<br>◆ Small chip area | ◆ High fabrication complexity<br>◆ Not suitable for pigmented inks | ◆ IJ22 |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFELL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal ink jet<br>◆ Piezoelectric ink jet<br>◆ IJ01–IJ07, IJ10—IJ14, IJ16, IJ20, IJ22–IJ45 |

-continued

NOZZLE REFELL METHOD

| | Description | Advantages | Disadvantages | Examples |
|---|---|---|---|---|
| | surface tension at the nozzle then exerts a small force restoring the meniscus to a minimum area. This force refills the nozzle. | | | |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | ◆ High speed<br>◆ Low actuator energy, as the actuator need only open or close the shutter, instead of ejecting the ink drop | ◆ Requires common ink pressure oscillator<br>◆ May not be suitable for pigmented inks | ◆ IJ08, IJ13, IJ15, IJ17, IJ18, IJ19, IJ21 |
| Refill actuator | After the main actuator has ejected a drop a second (refill) actuator is energized. The refill actuator pushes ink into the nozzle chamber. The refill actuator returns slowly, to prevent its return from emptying the chamber again. | ◆ High speed, as the nozzle is actively refilled | ◆ Requires two independent actuators per nozzle | ◆ IJ09 |
| Positive ink pressure | The ink is held a slight positive pressure. After the ink drop is ejected, the nozzle chamber fills quickly as surface tension and ink pressure both operate to refill the nozzle. | ◆ High refill rate, therefore a high drop repetition rate is possible | ◆ Surface spill must be prevented<br>◆ Highly hydrophobic print head surfaces are required | ◆ Silverbrook, EP 0771 658 A2 and related patent applications<br>◆ Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | ◆ Design simplicity<br>◆ Operational simplicity<br>◆ Reduces crosstalk | ◆ Restricts refill rate<br>◆ May result in a relatively large chip area<br>◆ Only partially effective | ◆ Thermal ink jet<br>◆ Piezoelectric ink jet<br>◆ IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out | ◆ Drop selection and separation forces can be reduced<br>◆ Fast refill time | ◆ Requires a method (such as a nozzle rim or effective hydrophobizing, or both) to prevent flooding of the ejection surface of the print head. | ◆ Silverbrook, EP 0771 658 A2 and related patent applications<br>◆ Possible operation of the following: IJ01–IJ07, IJ09–IJ12, IJ14, IJ16, IJ20, IJ22, , IJ23–IJ34, IJ36–IJ41, IJ44 |

-continued

METHOD OF RESTRICTING BACK-FLOW THROUGH INLET

| | Description | Advantages | Disadvantages | Examples |
|---|---|---|---|---|
| Baffle | through the inlet. One or more baffles are placed in the inlet ink flow. When the actuator is energized, the rapid ink movement creates eddies which restrict the flow through the inlet. The slower refill process is unrestricted, and does not result in eddies. | ◆ The refill rate is not as restricted as the long inlet method.<br>◆ Reduces crosstalk | ◆ Design complexity<br>◆ May increase fabrication complexity (e.g. Tektronix hot melt Piezoelectric print heads). | ◆ HP Thermal Ink Jet<br>◆ Tektronix piezoelectric ink jet |
| Flexible flap restricts inlet | In this method recently disclosed by Canon, the expanding actuator (bubble) pushes on a flexible flap that restricts the inlet. | ◆ Significantly reduces back-flow for edge-shooter thermal ink jet devices | ◆ Not applicable to most ink jet configurations<br>◆ Increased fabrication complexity<br>◆ Inelastic deformation of polymer flap results in creep over extended use | ◆ Canon |
| Inlet filter | A filter is located between the ink inlet and the nozzle chamber. The filter has a multitude of small holes or slots, restricting ink flow. The filter also removes particles which may block the nozzle. | ◆ Additional advantage of ink filtration<br>◆ Ink filter may be fabricated with no additional process steps | ◆ Restricts refill rate<br>◆ May result in complex construction | ◆ IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | ◆ Design simplicity | ◆ Restricts refill rate<br>◆ May result in a relatively large chip area<br>◆ Only partially effective | ◆ IJ02, IJ37, IJ44 |
| Inlet shutter | A secondary actuator controls the position of a shutter, closing off the ink inlet when the main actuator is energized. | ◆ Increases speed of the ink-jet print head operation | ◆ Requires separate refill actuator and drive circuit | ◆ IJ09 |
| The inlet is located behind the ink-pushing surface | The method avoids the problem of inlet back-flow by arranging the ink-pushing surface of the actuator between the inlet and the nozzle. | ◆ Back-flow problem is eliminated | ◆ Requires careful design to minimize the negative pressure behind the paddle | ◆ IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | ◆ Significant reductions in back-flow can be achieved<br>◆ Compact designs possible | ◆ Small increase in fabrication complexity | ◆ IJ07, IJ20, IJ26, IJ38 |
| Nozzle actuator does not result in ink back-flow | In some configurations of ink jet, there is no expansion or movement of an actuator which may cause ink back-flow through the inlet. | ◆ Ink back-flow problem is eliminated | ◆ None related to ink back-flow on actuation | ◆ Silverbrook, EP 0771 658 A2 and related patent applications<br>◆ Valve-jet<br>◆ Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | ◆ No added complexity on the print head | ◆ May not be sufficient to displace dried ink | ◆ Most ink jet systems<br>◆ IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40,, IJ41, IJ42, IJ43, IJ44,, IJ45 |
| Extra power to ink heater | In systems which heat the ink, but do not boil it under normal situations, nozzle clearing can be achieved by over-powering the heater and boiling ink at the nozzle. | ◆ Can be highly effective if the heater is adjacent to the nozzle | ◆ Requires higher drive voltage for clearing<br>◆ May require larger drive transistors | ◆ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | ◆ Does not require extra drive circuits on the print head<br>◆ Can be readily controlled and initialed by digital logic | ◆ Effectiveness depends substantially upon the configuration of the ink jet nozzle | ◆ May be used with: IJ01, IJ02, IJ03, IJ04, IJ05, IJ06, IJ07, IJ09,.U10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | ◆ A simple solution where applicable | ◆ Not suitable where there is a hard limit to actuator movement | ◆ May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ◆ A high nozzle clearing capability can be achieved<br>◆ May be implemented at very low cost in systems which already include acoustic actuators | ◆ High implementation cost if system does not already include an acoustic actuator | ◆ IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | ◆ Can clear severely clogged nozzles | ◆ Accurate mechanical alignment is required<br>◆ Moving parts are required<br>◆ There is risk of damage to the nozzles<br>◆ Accurate fabrication is required | ◆ Silverbrook, EP 0771 658 A2 and related patent applications |
| Ink pressure pulse | The pressure of the ink is temporarily increased so that ink streams from all of the nozzles. This may be used in conjunction | ◆ May be effective where other methods cannot be used | ◆ Requires pressure pump or other pressure actuator<br>◆ Expensive<br>◆ Wasteful of ink | ◆ May be used with all IJ series ink jets |

-continued

NOZZLE CLEARING METHOD

| | Description | Advantages | Disadvantages | Examples |
|---|---|---|---|---|
| Print head wiper | with actuator energizing. A flexible 'blade' is wiped across the print head surface. The blade is usually fabricated from a flexible polymer, e.g. rubber or synthetic elastomer. | ◆ Effective for planar print head surfaces<br>◆ Low cost | ◆ Difficult to use if print head surface is non-planar or very fragile<br>◆ Requires mechanical parts<br>◆ Blade can wear out in high volume print systems | ◆ Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required | ◆ Can be effective where other nozzle clearing methods cannot be used<br>◆ Can be implemented at no additional cost in some ink jet configurations | ◆ Fabrication complexity | ◆ Can be used with many IJ series ink jets |

| | Description | Advantages | Disadvantages | Examples |
|---|---|---|---|---|
| | | NOZZLE PLATE CONSTRUCTION | | |
| Electroformed nickel | A nozzle plate is separately fabricated from electroformed nickel, and bonded to the print head chip. | ◆ Fabrication simplicity | ◆ High temperatures and pressures are required to bond nozzle plate<br>◆ Minimum thickness constraints<br>◆ Differential thermal expansion | ◆ Hewlett Packard Thermal Ink jet |
| Laser ablated or drilled polymer | Individual nozzle holes are ablated by an intense UV laser in a nozzle plate, which is typically a polymer such as polyimide or polysulphone | ◆ No masks required<br>◆ Can be quite fast<br>◆ Some control over nozzle profile is possible<br>◆ Equipment required is relatively low cost | ◆ Each hole must be individually formed<br>◆ Special equipment required<br>◆ Slow where there are many thousands of nozzles per print head<br>◆ May produce thin burrs at exit holes | ◆ Canon Bubblejet<br>◆ 1988 Sercel et al., SPIE, Vol. 998 Excimer Beam Applications, pp. 76–83<br>◆ 1993 Watanabe et al., U.S. Pat. No. 5,208,604 |
| Silicon micromachined | A separate nozzle plate is micromachined from single crystal silicon, and bonded to the print head wafer. | ◆ High accuracy is attainable | ◆ Two part construction<br>◆ High cost<br>◆ Requires precision alignment<br>◆ Nozzles may be clogged by adhesive | ◆ K. Bean, IEEE Transactions on Electron Devices, Vol. ED-25, No. 10, 1978, pp 1185–1195<br>◆ Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | ◆ No expensive equipment required<br>◆ Simple to make single nozzles | ◆ Very small nozzle sizes are difficult to form<br>◆ Not suited for mass production | ◆ 1970 Zoltan U.S. Pat. No. 3,683,212 |
| Monolithic, surface micromachined using VLSI litho- | The nozzle plate is deposited as a layer using standard VLSI deposition techniques. Nozzles are etched in the nozzle plate using | ◆ High accuracy (<1 $\mu$m)<br>◆ Monolithic<br>◆ Low cost<br>◆ Existing processes can be used | ◆ Requires sacrificial layer under the nozzle plate to form the nozzle chamber<br>◆ Surface may be fragile to the touch | ◆ Silverbrook, EP 0771 658 A2 and related patent applications<br>◆ IJ01, IJ02, IJ04, IJ11, IJ12, IJ17, |

-continued

|  | Description | Advantages | Disadvantages | Examples |
|---|---|---|---|---|
| graphic processes | VLSI lithography and etching. |  |  | IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | ◆ High accuracy (<1 μm)<br>◆ Monolithic<br>◆ Low cost<br>◆ No differential expansion | ◆ Requires long etch times<br>◆ Requires a support wafer | ◆ IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | ◆ No nozzles to become clogged | ◆ Difficult to control drop position accurately<br>◆ Crosstalk problems | ◆ Ricoh 1995 Sekiya et al U.S. Pat. No. 5,412,413<br>◆ 1993 Hadimioglu et al EUP 550,192<br>◆ 1993 Elrod et al EUP 572,220 |
| Trough | Each drop ejector has a trough through which a paddle moves. There is no nozzle plate. | ◆ Reduced manufacturing complexity<br>◆ Monolithic | ◆ Drop firing direction is sensitive to wicking. | ◆ IJ35 |
| Nozzle slit instead of individual nozzles | The elimination of nozzle holes and replacement by a slit encompassing many actuator positions reduces nozzle clogging, but increases crosstalk due to ink surface waves | ◆ No nozzles to become clogged | ◆ Difficult to control drop position accurately<br>◆ Crosstalk problems | ◆ 1989 Saito et al U.S. Pat. No. 4,799,068 |

DROP EJECTION DIRECTION

|  | Description | Advantages | Disadvantages | Examples |
|---|---|---|---|---|
| Edge ('edge shooter') | Ink flow is along the surface of the chip, and ink drops are ejected from the chip edge. | ◆ Simple construction<br>◆ No silicon etching required<br>◆ Good heat sinking via substrate<br>◆ Mechanically strong<br>◆ Ease of chip handing | ◆ Nozzles limited to edge<br>◆ High resolution is difficult<br>◆ Fast color printing requires one print head per color | ◆ Canon Bubblejet 1979 Endo et al GB patent 2,007,162<br>◆ Xerox heater-in-pit 1990 Hawkins et al U.S. Pat. No. 4,899,181<br>◆ Tone-jet |

DROP EJECTION DIRECTION

|  | Description | Advantages | Disadvantages | Examples |
|---|---|---|---|---|
| Surface ('roof shooter') | Ink flow is along the surface of the chip, and ink drops are ejected from the chip surface, normal to the plane of the chip. | ◆ No bulk silicon etching required<br>◆ Silicon can make an effective heat sink<br>◆ Mechanical strength | ◆ Maximum ink flow is severely restricted | ◆ Hewlett-Packard TIJ 1982 Vaught et al U.S. Pat. No. 4,490,728<br>◆ IJ02, IJ11, IJ12, IJ20, IJ22 |
| Through chip, forward ('up shooter') | Ink flow is through the chip, and ink drops are ejected from the front surface of the chip. | ◆ High ink flow<br>◆ Suitable for pagewidth print heads<br>◆ High nozzle packing density therefore low manufacturing cost | ◆ Requires bulk silicon etching | ◆ Silverbrook, EP 0771 658 A2 and related patent applications<br>◆ IJ04, IJ17, IJ18, IJ24, IJ27–IJ45 |
| Through chip, reverse | Ink flow is through the chip, and ink drops are ejected from the rear | ◆ High ink flow<br>◆ Suitable for pagewidth print | ◆ Requires wafer thinning<br>◆ Requires special | ◆ IJ01, IJ03, IJ05, IJ06, IJ07, IJ08, IJ09, IJ10, IJ13, |

-continued

DROP EJECTION DIRECTION

| | Description | Advantages | Disadvantages | Examples |
|---|---|---|---|---|
| ('down shooter') | surface of the chip. | ◆ heads High nozzle packing density therefore low manufacturing cost | handling during manufacture | IJ14, IJ15, IJ16, IJ19, IJ21, IJ23, IJ25, IJ26 |
| Through actuator | Ink flow is through the actuator, which is not fabricated as part of the same substrate as the drive transistors. | ◆ Suitable for piezoelectric print heads | ◆ Pagewidth print heads require several thousand connections to drive circuits<br>◆ Cannot be manufactured in standard CMOS fabs<br>◆ Complex assembly required | ◆ Epson Stylus<br>◆ Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | ◆ Environmentally friendly<br>◆ No odor | ◆ Slow drying<br>◆ Corrosive<br>◆ Bleeds on paper<br>◆ May strikethrough<br>◆ Cockles paper | ◆ Most existing ink jets<br>◆ All IJ series ink jets<br>◆ Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | ◆ Environmentally friendly<br>◆ No odor<br>◆ Reduced bleed<br>◆ Reduced wicking<br>◆ Reduced strikethrough | ◆ Slow drying<br>◆ Corrosive<br>◆ Pigment may clog nozzles<br>◆ Pigment may clog actuator mechanisms<br>◆ Cockles paper | ◆ IJ02, IJ04, IJ21, IJ26, IJ27, IJ30<br>◆ Silverbrook, EP 0771 658 A2 and related patent applications<br>◆ Piezoelectric ink-jets<br>◆ Thermal ink jets (with significant restrictions) |
| Methyl Ethyl Ketone (MEK) | MEK is a highly volatile solvent used for industrial printing on difficult surfaces such as aluminum cans. | ◆ Very fast drying<br>◆ Prints on various substrates such as metals and plastics | ◆ Odorous<br>◆ Flammable | ◆ All IJ series ink jets |
| Alcohol (ethanol, 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | ◆ All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | ◆ No drying time-ink instantly freezes on the print medium<br>◆ Almost any print medium can be used<br>◆ No paper cockle occurs<br>◆ No wicking occurs<br>◆ No bleed occurs<br>◆ No strikethrough occurs | ◆ High viscosity<br>◆ Printed ink typically has a 'waxy' feel<br>◆ Printed pages may 'block'<br>◆ Ink temperature may be above the curie point of permanent magnets<br>◆ Ink heaters consume power<br>◆ Long warm-up time | ◆ Tektronix hot melt piezoelectric ink jets<br>◆ 1989 Nowak U.S. Pat. No. 4,820,346<br>◆ All IJ series ink jets |
| Oil | Oil based inks are extensively used in | ◆ High solubility medium for some | ◆ High viscosity: this is a significant | ◆ All IJ series ink jets |

-continued

INK TYPE

| | Description | Advantages | Disadvantages | Examples |
|---|---|---|---|---|
| | offset printing. They have advantages in improved characteristics on paper (especially no wicking or cockle). Oil soluble dies and pigments are required. | ◆ dyes<br>◆ Does not cockle paper<br>◆ Does not wick through paper | limitation for use in ink jets, which usually require a low viscosity. Some short chain and multi-branched oils have a sufficiently low viscosity.<br>◆ Slow drying | |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | ◆ All series ink jets |

What is claimed is:

1. A method of manufacture of a thermally actuated ink jet printer comprising a series of nozzle chambers from each of which ink is ejected via the utilization of a thermal actuator device, the method comprising the steps of:

(a) initially providing a silicon wafer having a circuitry wafer layer including electrical circuitry necessary for the operation of the thermal actuator device on demand;

(b) etching at least one nozzle chamber pit in said circuitry wafer layer and said silicon wafer;

(c) depositing and etching a sacrificial layer filling said at least one nozzle chamber pit, said etching including etching a first portion of a nozzle chamber wall mould and an actuator anchor mould;

(d) depositing and etching a first inert material layer filling said nozzle chamber wall mould and said actuator anchor mould, said etching including etching a via to said electrical circuitry;

(e) depositing and etching a first conductive material layer defining a lower heater element conductively interconnected via said via with said electrical circuitry;

(f) depositing and etching a second inert material layer, said etching defining an actuator arm attached to said lower heater element and a second portion of said nozzle chamber wall;

(g) depositing and etching a second conductive material layer defining an upper heater element conductively interconnected via a via through said first and second inert material layers with said electrical circuitry;

(h) depositing and etching a third inert material layer defining an actuator anchor and further portions of said nozzle chamber wall;

(i) depositing and etching a sacrificial layer;

(j) depositing and etching a fourth inert material layer defining remaining portions of said nozzle chamber, said etching including etching at least one ink ejection nozzle in one of said nozzle chamber walls;

(k) etching an ink supply channel to said nozzle chamber through said wafer; and (l) etching away said sacrificial layers.

2. A method as claimed in claim 1 wherein said step (k) includes etching an interconnecting channel to one of said nozzle chamber pits.

3. A method as claimed in claim 1 wherein the number of ink ejection nozzles is at least two.

4. A method as claimed in claim 1 wherein said conductive material layers are formed from a material having a high Youngs modulus.

5. A method as claimed in claim 1 further comprising the step of etching an ink supply channel through said wafer from a back surface thereof.

6. A method as claimed in claim 1 wherein said wafer comprises a double sided polished CMOS wafer.

7. A method as claimed in claim 1 wherein at least step (l) is also utilized to simultaneously separate said wafer into separate printheads.

8. A method as claimed in claim 1 wherein said conductive material layers comprise substantially titanium nitride or a copper nickel alloy.

9. A method as claimed in claim 1 wherein said inert material layers comprise substantially glass.

* * * * *